(12) United States Patent
Chu et al.

(10) Patent No.: US 11,967,169 B2
(45) Date of Patent: Apr. 23, 2024

(54) IN-DISPLAY CAPACITIVE FINGERPRINT SENSOR

(71) Applicant: Synaptics Incorporated, San Jose, CA (US)

(72) Inventors: Xi Chu, San Jose, CA (US); Guozhong Shen, Fremont, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 17/934,474

(22) Filed: Sep. 22, 2022

(65) Prior Publication Data

US 2023/0095731 A1 Mar. 30, 2023

Related U.S. Application Data

(60) Provisional application No. 63/249,472, filed on Sep. 28, 2021.

(51) Int. Cl.
| | |
|---|---|
| *G06F 3/044* | (2006.01) |
| *G01D 5/24* | (2006.01) |
| *G06F 3/041* | (2006.01) |
| *G06V 40/13* | (2022.01) |
| *H10K 59/40* | (2023.01) |

(52) U.S. Cl.
CPC .......... *G06V 40/1306* (2022.01); *G01D 5/24* (2013.01); *G06F 3/0412* (2013.01); *G06F 3/04164* (2019.05); *G06F 3/0445* (2019.05); *G06F 3/0446* (2019.05); *H10K 59/40* (2023.02); *G06F 2203/04103* (2013.01)

(58) Field of Classification Search
CPC .. G06F 3/0445; G06F 3/0446; G06F 3/04164; G06F 3/0412
See application file for complete search history.

(56) References Cited

U.S. PATENT DOCUMENTS

| | | | |
|---|---|---|---|
| 10,042,467 B2 | 8/2018 | Schwartz et al. | |
| 2017/0220182 A1 | 8/2017 | Schwartz et al. | |
| 2017/0235993 A1* | 8/2017 | Xu | G06V 40/1306 345/174 |
| 2017/0269440 A1* | 9/2017 | Yoshitomi | G06F 3/0446 |
| 2019/0018523 A1* | 1/2019 | Xu | G06F 3/0443 |
| 2019/0018540 A1* | 1/2019 | Ko | G06F 3/0445 |

\* cited by examiner

*Primary Examiner* — Lisa S Landis
(74) *Attorney, Agent, or Firm* — Leydig, Voit & Mayer, Ltd.

(57) ABSTRACT

A capacitive fingerprint sensor is configured to be integrated in a display. The capacitive fingerprint sensor includes a plurality of transmitter electrodes. Each respective transmitter electrode including at least one transmitter conductor formed in a first metal layer of a sensor stack and disposed between pixels of a display. The capacitive fingerprint sensor further includes a plurality of receiver electrodes. Each respective receiver electrode including at least one receiver conductor formed in a second metal layer of a sensor stack and disposed between pixels of the display. The receiver electrodes have an orientation different from the transmitter electrodes.

20 Claims, 14 Drawing Sheets

IN-DISPLAY CAPACITIVE FINGERPRINT SENSOR

CROSS REFERENCE TO RELATED APPLICATIONS

This application claims the benefit to U.S. Provisional Patent Application No. 63/249,472, filed on Sep. 28, 2021, which is hereby incorporated by reference herein.

FIELD

The disclosed embodiments relate generally to sensors, and more particularly to capacitive fingerprint and touch sensors that may be integrated within a display.

BACKGROUND

Input devices including touch sensor devices (e.g., touchpad sensors, touch screen displays, etc.), as well as fingerprint sensor devices, are used in a variety of electronic systems.

Touch sensor devices typically include a sensing region, often demarked by a surface, in which the touch sensor device determines position information (e.g., the presence, location, and/or motion) of one or more input objects, typically for purposes allowing a user to provide user input to interact with the electronic system. Fingerprint sensor devices also typically include a sensing region in which the fingerprint sensor device determines fingerprint information (e.g., images of a full or partial fingerprint pattern, fingerprint features such as ridges or minutia, etc.), typically for purposes relating to user authentication or identification.

Touch sensor devices and fingerprint sensor devices may thus be used to provide interfaces for the electronic system. For example, touch sensor devices and fingerprint sensor devices are often used as input devices for larger computing systems (such as opaque touchpads and fingerprint readers integrated in, or peripheral to, notebook or desktop computers). Touch sensor devices and fingerprint sensors are also often used in smaller computing systems such as mobile devices, e.g., smartphones and tablets.

Fingerprint sensor devices designed to capture fingerprint information typically differ from touch sensor devices that are designed to detect presence or position information of an input object such as a finger in a few ways. Most notably, capturing fingerprint information involves sampling much smaller structures than a typical touch sensor. While a touch sensor may be designed to sample an overall fingertip (e.g., on the order to approximately 5 mm in size or greater), a fingerprint sensor may be designed to sample individual surface variations on a fingertip surface (e.g., on the order of approximately 500 microns in size or less). As a result, the fingerprint sensor typically has a much higher spatial density of sensing elements than the touch sensor.

SUMMARY

One embodiment provides a capacitive sensor that is configured to be integrated in a display. The capacitive fingerprint sensor includes a plurality of transmitter electrodes. Each respective transmitter electrode includes at least one transmitter conductors formed in a first metal layer of a sensor stack and disposed between pixels of a display. The capacitive fingerprint sensor further includes a plurality of receiver electrodes. Each respective receiver electrode includes at least one receiver conductor formed in a second metal layer of a sensor stack and disposed between pixels of the display. The receiver electrodes have an orientation different from the transmitter electrodes.

Another embodiment provides an input device with a display comprising a touch sensor and a capacitive sensor. The display is formed from a plurality of display layers of a layer stack. The touch sensor includes a plurality of first touch sensor electrodes and a plurality of second touch sensor electrodes. Each of the plurality of first touch sensor electrodes is formed from conductors disposed in a first metal layer of a sensor stack, and each of the plurality of second touch sensor electrodes is formed from conductors disposed in the first metal layer of the sensor stack and from conductors disposed in a second metal layer of the sensor stack. The sensor stack is disposed on top of the display layers in the layer stack. The fingerprint sensor includes a plurality of first fingerprint sensor electrodes formed from conductors disposed in the first metal layer of the sensor stack and a plurality of second fingerprint sensor electrodes formed from conductors disposed in the second metal layer of the sensor stack.

Another embodiment comprises a method making capacitive sensor. The method includes forming a plurality of first conductors in a first metal layer of a sensor stack, forming an insulating layer on top of the first metal layer in the sensor stack, and forming a plurality of second conductors in a second metal layer, the second metal layer being formed on top of the insulating layer. The method further includes connecting the plurality of first conductors and the plurality of second conductors to a processing system. The first conductors form either transmitter electrodes or receiver electrodes of the capacitive fingerprint sensor, and the second conductors form the other of the transmitter electrodes or receiver electrodes not formed by the first conductors. The processing system is configured to modulate the plurality of transmitter electrodes relative to the receiver electrodes and to produce electrical signals indicative of input or lack of input in a sensing region of the capacitive fingerprint sensor.

DETAILED DESCRIPTION

The following detailed description is exemplary in nature and is not intended to limit the invention or the application and uses of the invention. Furthermore, there is no intention to be bound by any expressed or implied theory presented in the preceding field, background, brief description of the drawings, the following detailed description, or the appended abstract.

The terms "coupled with," along with its derivatives, and "connected to" along with its derivatives, may be used herein, including in the claims. "Coupled" or "connected" may mean one or more of the following: "coupled" or "connected" may mean that two or more elements are in direct physical or electrical contact; "coupled" or "connected" may also mean that two or more elements indirectly connect to each other, e.g., not in physical contact, but yet still cooperate or interact with each other, and may mean that one or more other elements are coupled or connected between the elements that are said to be coupled with or connected to each other.

Figure 1:
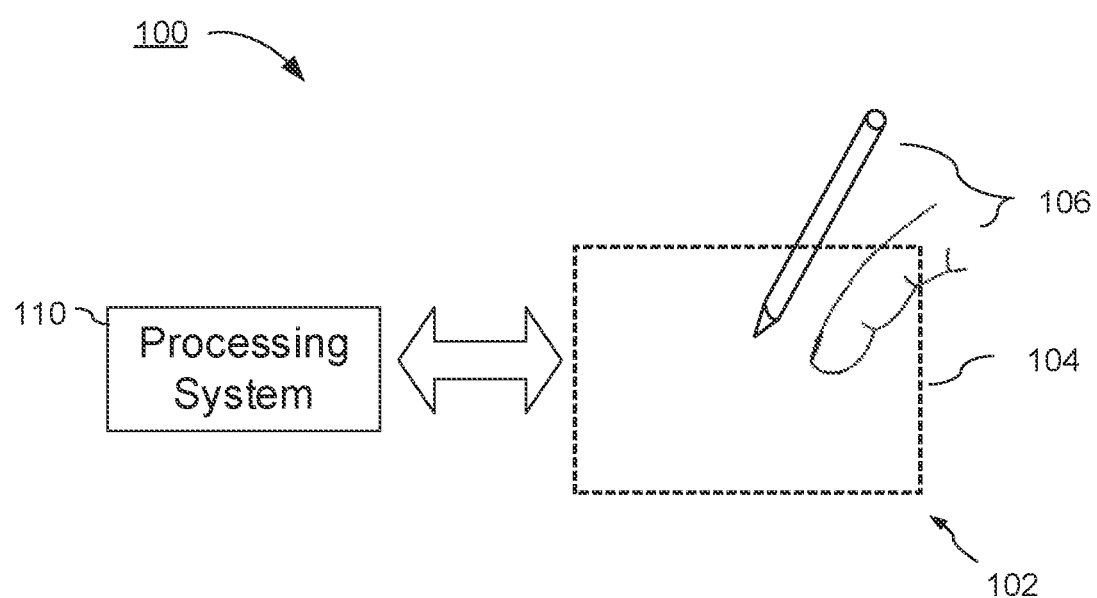
FIG. 1 is a block diagram of an example of an input device having a touch sensor, in accordance with certain embodiments.

FIG. 1 is a block diagram of an exemplary input device 100. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets—including foldable tablets, web browsers, e-book readers, personal digital assistants (PDAs), and wearable computers (such as smart watches and activity tracker devices). Additional examples of electronic systems include composite input devices, such as physical keyboards that include input device 100 and separate joysticks or key switches. Further examples of electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones—including foldable and rollable smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include I2C, SPI, PS/2, Universal Serial Bus (USB), Bluetooth, RF, and IRDA.

In FIG. 1, a touch sensor 102 is included with the input device 100. The touch sensor 102 comprises one or more sensing elements configured to sense input provided by one or more input objects 106 in a sensing region 104. Examples of input objects include fingers, styli, and hands. Sensing region 104 encompasses any space above, around, in and/or near the touch sensor 102 in which the input device 100 is able to detect user input (e.g., user input provided by one or more input objects). The sizes, shapes, and locations of particular sensing regions may vary from embodiment to embodiment. In some embodiments, the sensing region 104 extends from a surface of the input device 100 in one or more directions into space until signal-to-noise ratios prevent sufficiently accurate object detection. The distance to which this sensing region 104 extends in a particular direction, in some embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g., a touch surface) of the input device 100, contact with an input surface of the input device 100 in combination with some amount of applied force or pressure, and/or a combination thereof. In some embodiments, input surfaces may be provided by surfaces of sensor substrates within which or on which sensor elements are positioned, or by face sheets or other cover layers positioned over sensor elements.

The input device 100 may utilize any suitable combination of sensor components and sensing technologies to detect user input in the sensing region 104. Some implementations utilize arrays or other regular or irregular patterns of multiple sensing elements to detect the input. Exemplary sensing techniques that the input device 100 may use include capacitive sensing techniques, optical sensing techniques, acoustic (e.g., ultrasonic) sensing techniques, pressure-based (e.g., piezoelectric) sensing techniques, resistive sensing techniques, thermal sensing techniques, inductive sensing techniques, elastive sensing techniques, magnetic sensing techniques, and/or radar sensing techniques. The input device 100, for example, includes a touch sensor 102 that uses capacitive techniques where a voltage or current, referred to as a sensing signal, is applied to create an electric field. Nearby input objects cause changes in the electric field, and produce detectable changes in capacitive coupling that may be detected as changes in voltage, current, or the like referred to as a resulting signal. The sensor 102 includes, for example, sensor electrodes 352, 354 (FIG. 3), which are utilized as capacitive sensing elements.

One exemplary technique utilizes "mutual capacitance" (or "transcapacitance") sensing methods based on changes in the capacitive coupling between sensor electrodes. An input object near the sensor electrodes may alter the electric field between the sensor electrodes, thus changing the measured capacitive coupling. A transcapacitive sensing method may operate by detecting the capacitive coupling between one or more transmitter sensor electrodes (also "transmitter electrodes") and one or more receiver sensor electrodes (also "receiver electrodes"). Transmitter sensor electrodes may be modulated relative to a reference voltage to transmit one or more transmitter signals. Receiver sensor electrodes may be held substantially constant relative to the reference voltage to facilitate receipt of one or more resulting signals. The reference voltage may be a substantially constant voltage or system ground. The transmitter electrodes are modulated relative to the receiver electrodes to transmit transmitter signals and to facilitate receipt of resulting signals. A resulting signal may comprise effect(s) corresponding to one or more transmitter signals, and/or to one or more sources of environmental interference or other electromagnetic signals. When one or more input objects are present in a sensing region of the sensor, a resulting signal may also comprise effect(s) corresponding to the one or more input objects.

The input device 100 includes a processing system 110. The processing system 110 comprises parts of or all of one or more integrated circuits (ICs) and/or other circuitry components. The processing system 110 is coupled to (or configured to couple to) the touch sensor 102, and is configured to detect input in the sensing region 104 using sensing hardware of the touch sensor 102. In some embodiments, the processing system 110 includes electronically-readable instructions, such as firmware code, software code, and/or the like. The processing system 110 can be implemented as a physical part of the sensor 102, or can be physically separate from the sensor 102. Constituent components of the processing system 110 may be located together, or may be located physically separate from each other. For example, the input device 100 may be a peripheral coupled to a computing device, and the processing system 110 may comprise software configured to run on a central processing unit of the computing device and one or more ICs with associated firmware separate from the central processing unit (CPU). As another example, the input device 100 may be physically integrated in a mobile device, and the processing system 110 may comprise circuits and firmware that are part of a main processor of the mobile device. The processing system 110 may be dedicated to implementing the input device 100, or may perform other functions, such as operating display screens, driving haptic actuators, etc.

The processing system 110 may operate the sensing element(s) of the input device 100 to produce electrical signals indicative of input (or lack of input) in the sensing region 104. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, match biometric samples, and the like.

The touch sensor 102 is configured to detect position information of an input object 106 within the sensing region 104. The sensing region 104 may include an input surface having a larger area than the input object. The touch sensor 102 may include an array of sensing elements, such as capacitive sensing elements, with a resolution configured to detect a location of a touch to the input surface. In some embodiments, a pitch of the touch sensing elements or a spacing between an adjacent pair of the touch sensing elements is between 2 and 6 mm, although it will be appreciated that other geometries may be suitable.

Figure 2:
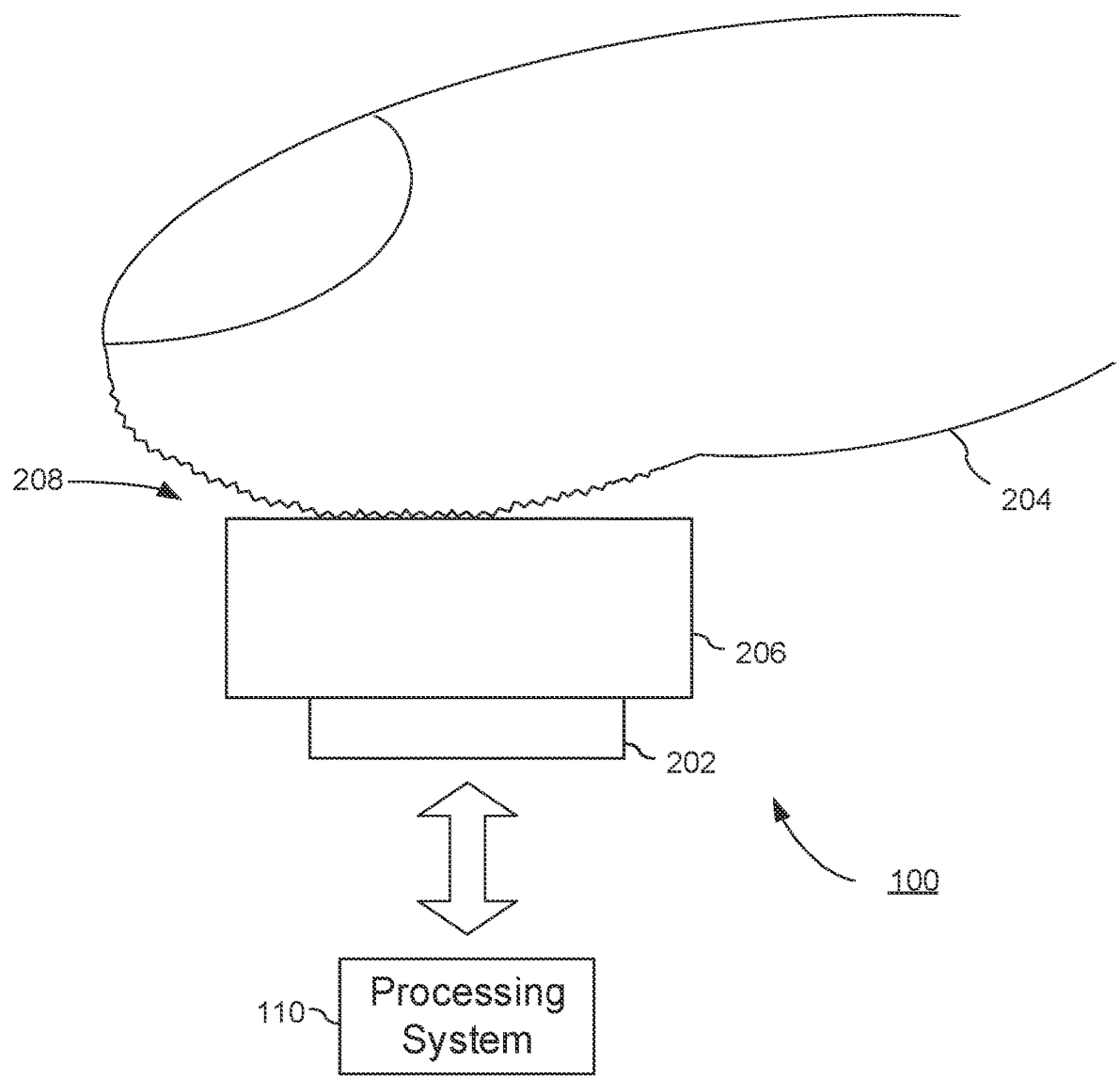
FIG. 2 is a block diagram of an example of an input device having a fingerprint sensor, in accordance with certain embodiments.

FIG. 2 illustrates a fingerprint sensor 202, e.g. of the input device 100. In certain embodiments, the fingerprint sensor 202 may be integrated within the area occupied by a display and/or the touch sensor 102 as described further herein. In other embodiments, the fingerprint sensor 202 may be physically separate from the touch sensor 102.

The fingerprint sensor 202 is configured to capture a fingerprint from a finger 204. The fingerprint sensor 202 is disposed underneath a cover layer 206 that provides an input surface for the fingerprint to be placed or swiped over the sensor 202. The cover layer 206 can, in some embodiments, extend over an entirety of a larger sensor, e.g., the display and/or the touch sensor 102 of the input device 100. A sensing region 208 of the fingerprint sensor 202 may include an input surface with an area larger than, smaller than, or similar in size to a full fingerprint. The fingerprint sensor 202 has an array of sensing elements, for example capacitive sensing elements, with a resolution configured to detect surface variations of the finger 204, and the fingerprint sensor 202 typically has a higher resolution than the touch sensor 102 of FIG. 1. In some embodiments, a pitch of the fingerprint sensing elements or a spacing between an adjacent pair of the fingerprint sensing elements is between 10 and 100 microns, although it will be appreciated that other geometries may be suitable.

Similar to the touch sensor, the fingerprint sensor 202 may be operated using transcapacitive or absolute capacitance sensing techniques. The fingerprint sensor 202 may operate under the control of the processing system 110, which may be the same processing system used for the touch sensor 102 (when present) or may be a different processing system.

Figure 3:
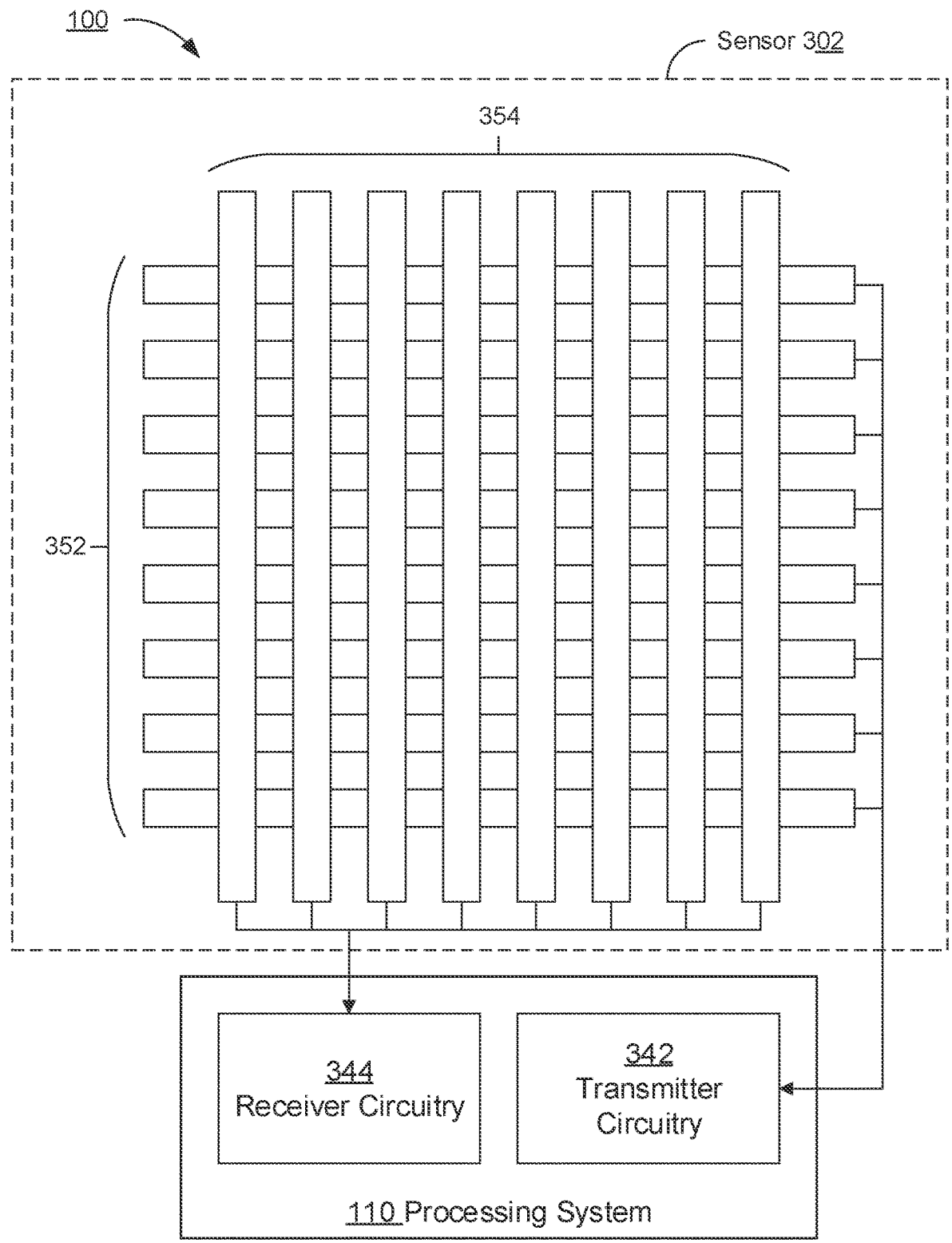
FIG. 3 is a block diagram of an example of capacitive sensing electrodes and control circuit in accordance with certain embodiments.

Referring to FIG. 3, the input device 100 includes in certain embodiments electrodes to facilitate capacitive touch sensing and/or fingerprint sensing. For example, the processing system 110 includes transmitter circuitry 342 and receiver circuitry 344. The transmitter circuitry 342 includes one or more transmitter circuits (e.g., drivers, etc.) configured to transmit one or more transmitter signals (sensing signals) with one or more transmitter sensor electrodes 352 of a sensor 302 wherein the sensor 302 may be the touch sensor 102 and/or fingerprint sensor 202 previously described. The receiver circuitry 344 includes one or more receiver circuits (e.g., analog front ends, analog-to-digital converters, etc.) configured to receive one or more resulting signals with one or more receiver sensor electrodes of the touch sensor 102 and/or fingerprint sensor 202. The transmitter circuitry 342 may be coupled to the one or more transmitter electrodes 352 directly or through one or more intermediate electrical components (e.g., multiplexers, switches, amplifiers, and the like). Likewise, the receiver circuitry 344 may be coupled to the one or more receiver electrodes 354 directly or through one or more intermediate electrical components such as multiplexers, switches, amplifiers, and the like. Where the input device 100 includes both a touch sensor and a fingerprint sensor, it will be understood that each sensor may have its own associated receiver circuitry 344 and transmitter circuitry 342. Alternatively, the same receiver circuitry 344 and transmitter circuitry 342 may be used to control both the touch sensor and fingerprint circuitry.

In some embodiments, separate ones of the sensor electrodes 352, 354 may be ohmically shorted together to form larger sensing elements. For example, in a first mode of operation, each of the sensor electrodes may be operated independently, and in a second mode of operation, multiple ones of the sensor electrodes may be operated together by ohmically shorting them together.

Figure 4:
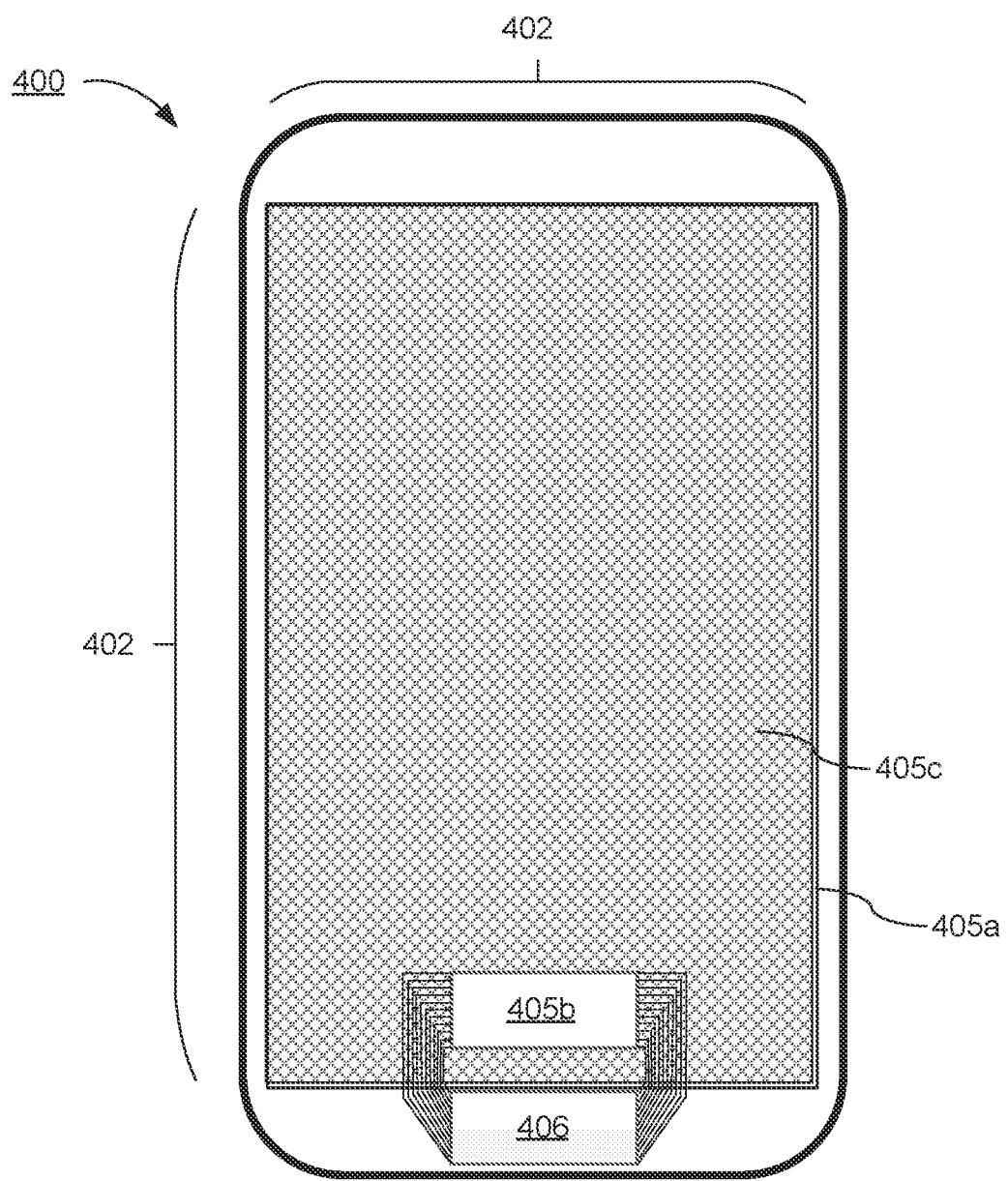
FIG. 4 is a schematic diagram illustrating, in accordance with certain embodiments, an active area of a display of an electronic device having a touch sensor and a fingerprint sensor.

FIG. 4 illustrates an exemplary electronic device 400 having a fingerprint sensor 405b (which can be, e.g., the fingerprint sensor 202) in a portion of the active area 402 of a display. By way of example only, the electronic device 400 may be a mobile phone, such as a foldable or rollable phone. Fingerprint sensor 405b is a capacitive fingerprint sensor. The electronic device 400 further includes a touch sensor 405a, which can be the touch sensor 102 in the active area of the display 402. Routing (communication) conductors such as, for example, metal traces connect touch sensor 405a and fingerprint sensor 405b with processing system 406, which may be one or more integrated circuits, ASICs, etc. The routing conductors provide drive signals to operate the touch sensor 405a and the fingerprint sensor 405b and to process resulting signals. The processing system 406 can, according to various embodiments, include separate transmitter circuitry and receiver circuitry for each of the touch sensor 405a and the fingerprint sensor 405b. In other embodiments, the processing system can include combined transmitter circuitry for both the touch sensor 405a and the fingerprint sensor 405b and/or combined receiver circuitry for both sensors. In some embodiments, the transmitter/receiver processing circuitry for both the touch sensor 405a and the fingerprint sensor 405b may be incorporated into touch driver integrated circuit (IC) or a touch display driver integrated circuit (TDDI).

Also shown are examples of touch sensor pixel elements, which may also be referred to as tixels 405c. The tixels 405c are not necessarily shown to scale nor in their actual shapes. Each tixel 405c may be formed by individual electrodes or by ohmically shorting a plurality of component sensor electrodes (e.g., multiple transmitter electrode conductors or multiple receiver electrode conductors) together to form an aggregation of electrically common component sensor electrodes (e.g., an aggregation of electrically common electrode conductors). The receiver electrode conductors and the transmitter electrode conductors can be, for example, wire traces or any other suitable conductor. Each respective transmitter electrode tixel is electrically isolated from neighboring receiver electrode tixels, and vice versa. Similarly, respective transmitter electrode tixels 405c can be electrically connected to other neighboring transmitter electrode tixels 405c along a first dimension, e.g., a horizontal direction, while respective receiver electrode tixels 405c can be electrically connected to other neighboring receiver electrode tixels along a second dimension, e.g., a vertical direction perpendicular to the horizontal direction. Connecting neighboring transmitter electrode tixels along a first direction perpendicular to a second direction along which neighboring receiver electrode tixels are connected can provide, e.g., the configuration of the transmitter electrodes 352 and the receiver electrodes 354 shown in FIG. 3 or equivalent.

The touch sensor 405a and the fingerprint sensor 405b are provided by a sensor stack that in certain embodiments are formed integrated with a display stack in a display device extending over all or part of the active area 402 of the electronic device. While the active area 402 of the electronic device—as well as the touch sensor 405a and the fingerprint sensor 405b—extend over an xy-plane (shown in FIG. 4), the sensor stack and the display stack extend in a z-direction (shown, e.g., in FIGS. 5 and 8 below) perpendicular to the xy-plane.

The display device formed by the display stack may be any suitable type of dynamic display capable of displaying a visual interface to a user, including an inorganic light emitting diode (ILED) display, organic LED (OLED) display, liquid crystal display (LCD), plasma display, electroluminescence (EL) display, or other display technology. The display may be flexible or rigid, and may be flat, curved, or have other geometries. The display may include a glass or plastic substrate for thin-film transistor (TFT) circuitry, which may be used to address display pixels for providing visual information and/or providing other functionality. The display device may include a cover lens, such as the cover layer 206 of FIG. 2, sometimes referred to as a "cover glass," disposed above the display circuitry and above inner layers of the display module, and the cover lens may also provide an input surface for the input device 100. Examples of cover lens materials include optically clear amorphous solids, such as chemically hardened glass, and optically clear crystalline structures, such as sapphire. In addition, the cover lens materials can include a series of layers, e.g., organic and or inorganic layers (501C in FIG. 5), that collectively form a cover lens stack.

The input device 100 and the display device may share physical elements. For example, some of the same electrical components may be utilized for both displaying visual information and for input sensing (touch or fingerprint) with the input device 100, such as using one or more display electrodes for both display updating and input sensing. As another example, the display screen may be operated in part or in total by the processing system 110 in communication with the input device (e.g., when the processing system is a TDDI).

Figure 5:
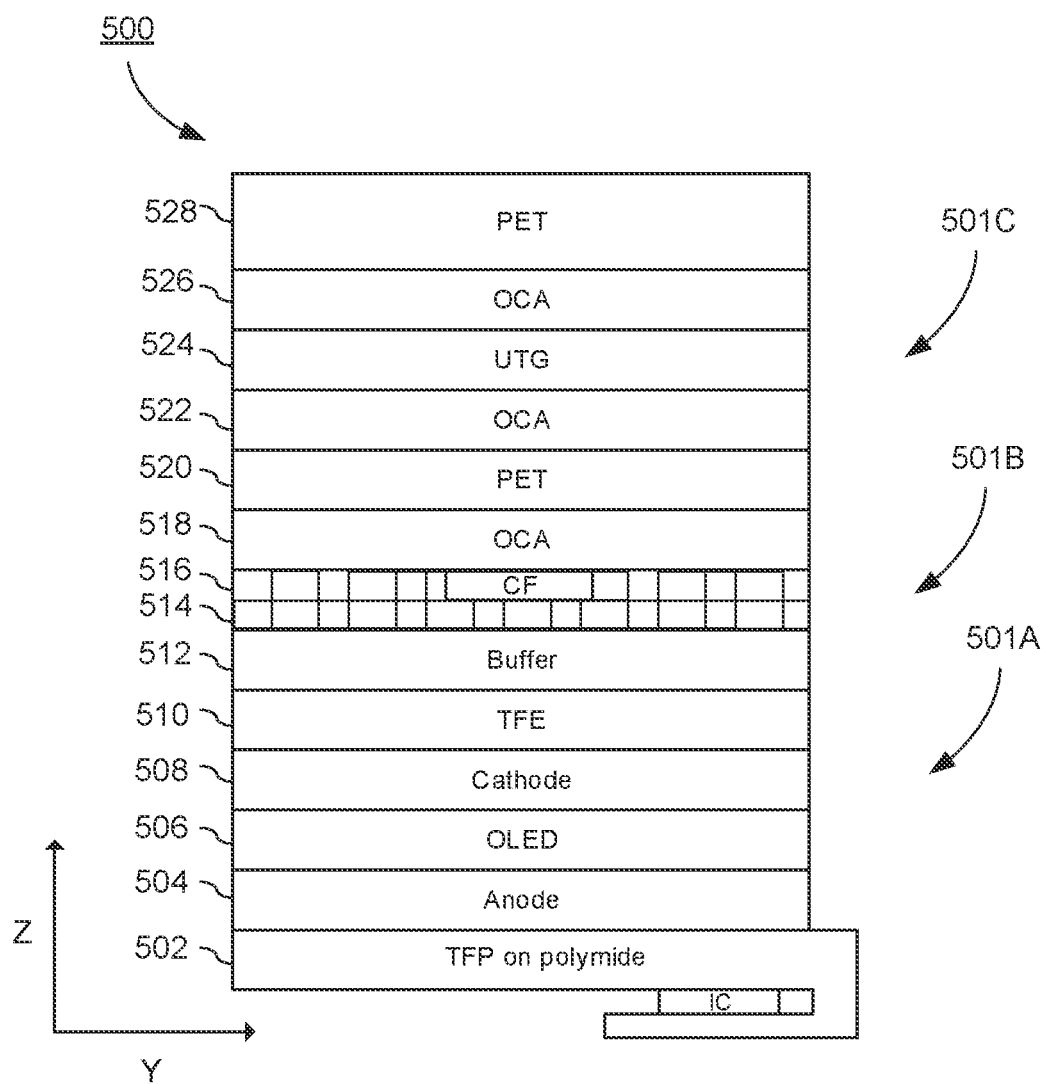
FIG. 5 illustrates a layer stack, in accordance with certain embodiments, for a combined OLED display, touch sensor and fingerprint sensor.

FIG. 5 illustrates an example of a configuration, in a z-direction (e.g., bottom to top), for a combination of a display stack, sensor stack, and cover lens stack—which can collectively be referred to as a touch sensor display stack. It will be appreciated that FIG. 5 is merely one exemplary configuration, and that a variety of other configuration are also possible. The touch sensor display stack illustrated in FIG. 5 can be, for example, the touch sensor display stack for a foldable mobile phone or a foldable tablet computer.

Figure 6A:
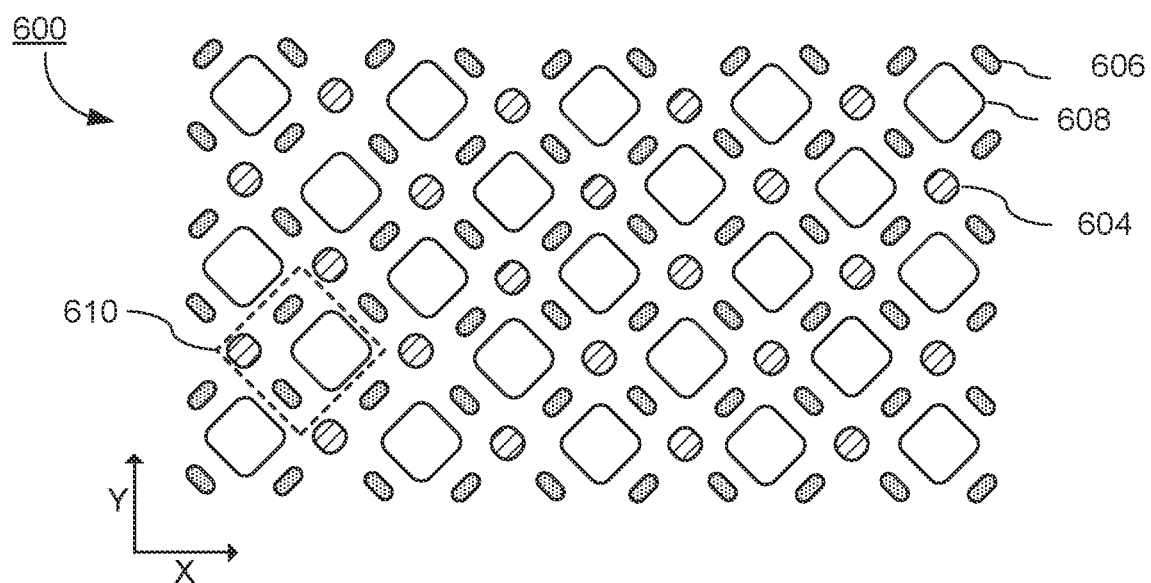
FIGS. 6A and 6B illustrate examples of configurations of color sub-pixel arrangements of an OLED display in accordance with certain embodiments.
Figure 6B:
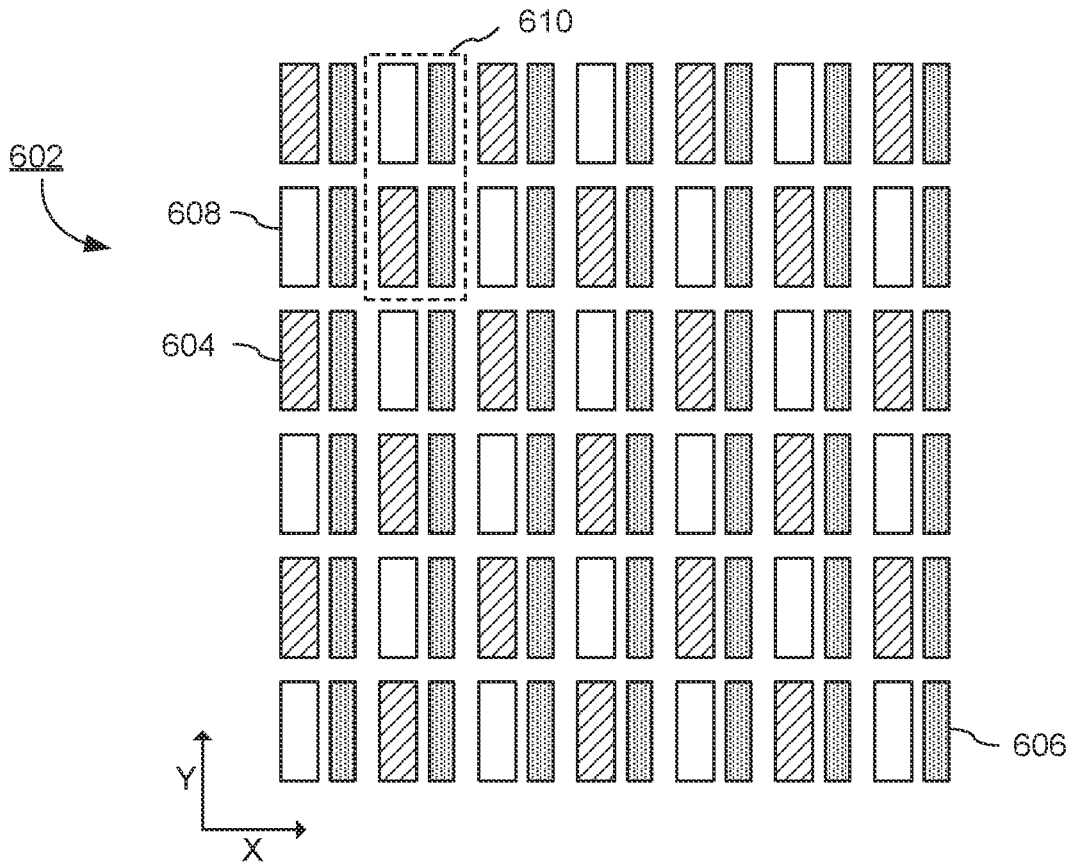

The touch sensor display stack 500 includes a display stack 501A, a sensor stack 501B, and a cover lens stack (cover stack) 501C. The display stack 501A includes a thin film transistor (TFT) layer 502 formed on a flexible polyimide substrate. Above the TFT layer 502, an anode 504, OLED layer 506, and cathode 508 are disposed. The OLED layer 506 includes an emissive layer that contains, for example, red, green, and blue emitter regions which are arranged, in the xy-plane, to form display pixels. Examples of possible emitter region configurations are depicted in FIGS. 6A and 6B (which are explained in more detail herein below). Above the cathode 508 lies a thin film encapsulation (TFE) layer 510, which can for example be on the order of 8 microns thick and a buffer 512, which can for example be on the order of 2 microns thick, followed by a color filter 514. In alternative embodiments, the thicknesses of the TFE layer 510 and the buffer can be of any suitable thickness.

In the embodiment illustrated in FIG. 5, the sensor stack 501B consists of metal mesh (MM) sensor layer 514 disposed beneath the color filter 516, which can be on the order of 5 microns thick. In alternative embodiments, the thickness of the color filter 516 can vary and be any suitable thickness. The MM sensor layer 514 includes a plurality of on-cell wire traces that serve as sensor electrodes, e.g., the transmitter electrodes 352 and the receiver electrodes 354 of the touch sensor 102 and/or fingerprint sensor 202, previously described. Individual on-cell wire traces of the MM sensor layer 514 can be ohmically shorted together to form a plurality, e.g., aggregations, of electrically common electrode traces, each aggregation forming a transmitter electrode or a receiver electrode, e.g., electrode tixels 405c.

The cover lens stack 501C is disposed above the sensor stack 501B. A purpose of the cover lens stack 501C is to protect the touch sensor and fingerprint sensor—as well as the display—disposed beneath the cover lens stack. The cover lens stack 501C corresponds, e.g., to the cover layer 206 of FIG. 2. In the illustrative example, the cover lens stack 501C includes an optical clear adhesive (OCA) layer 518 having a thickness on the order of 50 microns, a polyethylene (PET) layer 520 having a thickness on the order of 25 microns, a second OCA layer 522 having a thickness on the order of 50 microns, a layer of ultrathin glass (UTG) 524 having a thickness on the order of 30 microns, a third optical clear adhesive (OCA) 526 having a thickness on the order of 35 microns, and a second PET layer 528 having a thickness on the order 70 microns. It will be appreciated that the thicknesses described are by way of example, and that the thicknesses of the individual layers of the cover lens stack 501C can vary.

In certain embodiments—such as the embodiment illustrated in FIG. 5, the cover lens stack 501C has a thickness of less than 300 microns. In general, a thinner cover lens stack facilitates the ability of a fingerprint sensor provided in the MM sensor layer 516 to better detect ridges and valleys of a finger, placed on top of the cover lens stack 501C. A thin cover lens stack allows for detection of ridges and valleys of a finger with sufficient resolution to provide a signal to a processor circuit, e.g., the processor 406, that can be used to analyze properties of the finger, e.g., for fingerprint detection. In other embodiments, the cover lens stack has a thickness of less than about 450 microns. In yet other embodiments, the cover lens stack has a thickness greater than 450 microns.

As noted, the various layers described in connection with FIG. 5 are by way of example. It will be appreciated the touch sensor display stack 500 may include fewer or additional layers without departing from the various examples described herein.

FIGS. 6A and 6B illustrate typical RGB color emitter configurations of an OLED layer, e.g., the OLED layer 506, in an xy-plane. Both FIG. 6A and FIG. 6B illustrate Red Green Blue Green (RGBG) arrays, called PenTile®, that can be used in OLED displays. FIG. 6A illustrates a diamond PenTile array 600, while FIG. 6B illustrates a delta PenTile array 602. Each arrangement includes pixels 610 with Red 604, Green 606, and Blue 608 subpixels.

FIGS. 7A through 7E illustrate emitter configurations of an OLED layer, e.g., the OLED layer 506 as shown in FIGS. 6A-6B in the xy-plane, as well as conductors, such as wire traces of a metal mesh fingerprint sensor layer, e.g., the MM sensor layer 516, in the xy-plane. In FIGS. 7A through 7E, the wire traces are overlaid, in a z-direction perpendicular to the xy-plane, above the emitters of the OLED layer. As an example, the wire traces are disposed on the order of 10 or less microns (µm) above the OLED layer in the z-direction. As can be seen in each of FIGS. 7A through 7E, the wire traces are arranged so as to travel (be disposed) between individual emitters 604, 606, 608 of the OLED layer so that the wire traces do not block light emitted by individual diodes of the OLED layer.

Figure 7A:
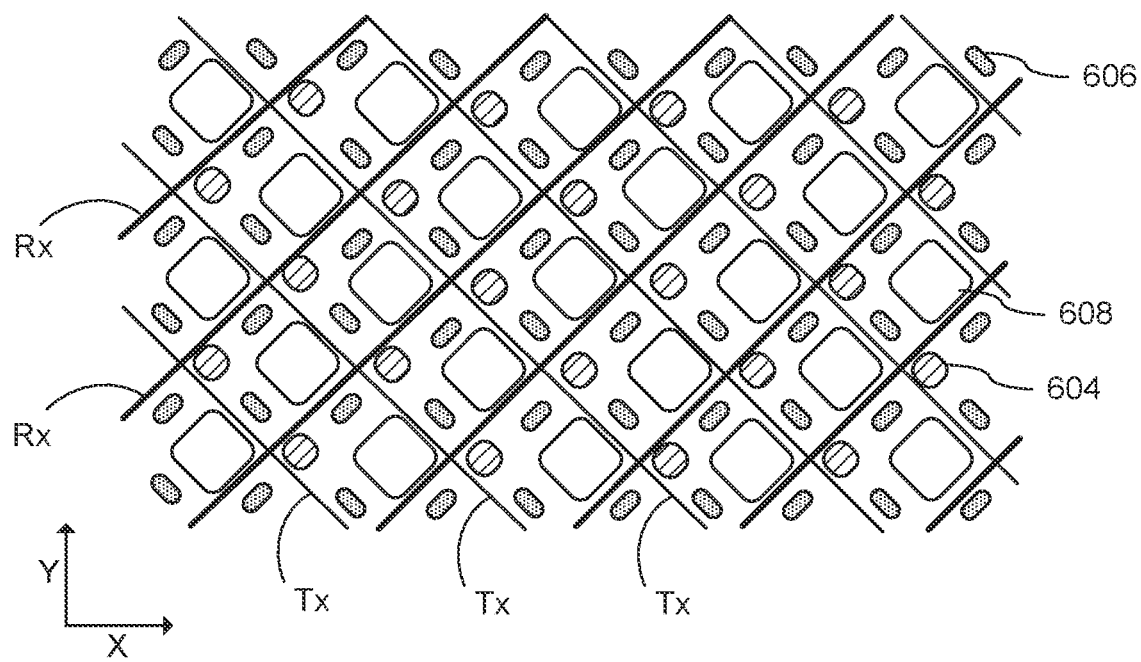
FIGS. 7A through 7E illustrate examples of portions of an OLED display having a fingerprint sensor in accordance with certain embodiments.
Figure 7B:
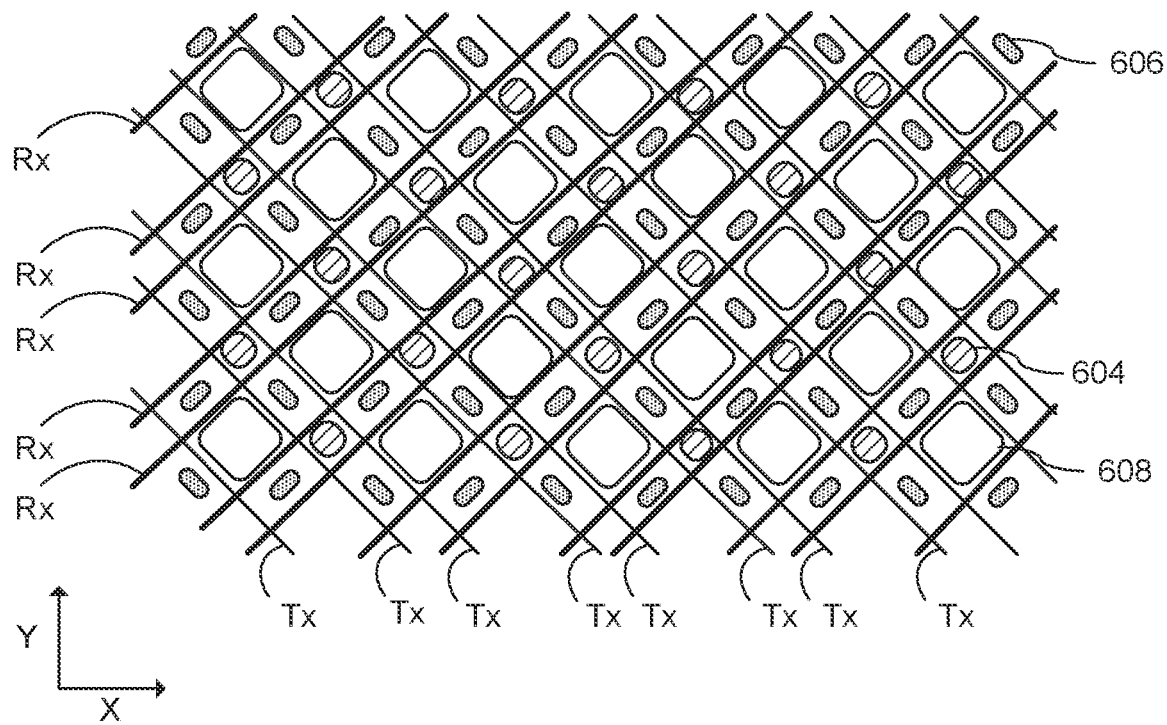
Figure 7C:
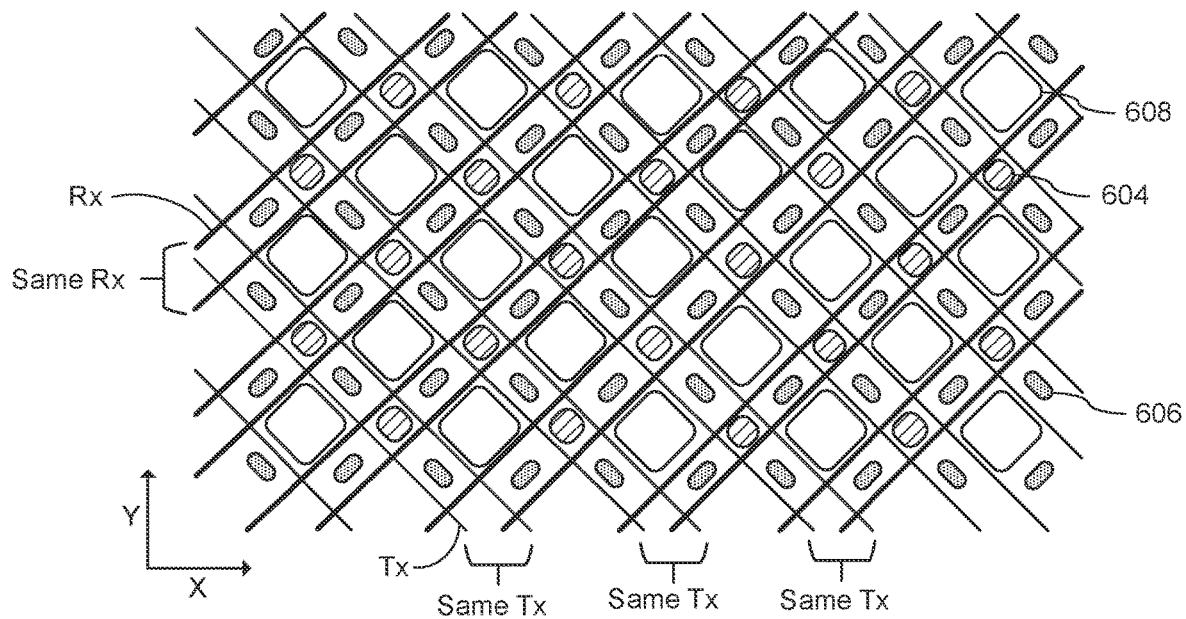
Figure 7D:
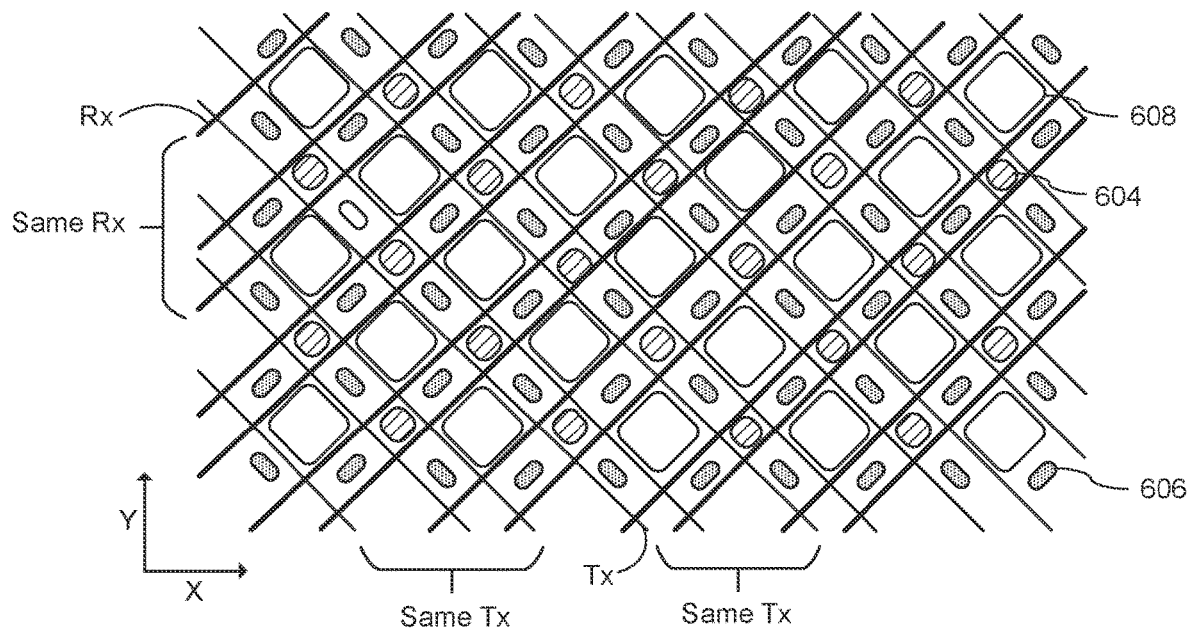

FIGS. 7A through 7D illustrate diamond PenTile Arrays with various wire trace configurations. In FIG. 7A, the wire traces, labelled Tx and Rx, have a pitch (e.g., distance between adjacent wire traces) equal to the width of a full RGBG display pixels of the diamond PenTile® array. Wire traces used as transmitter electrodes are denoted Tx (and have a negative slope in FIG. 7A) while wire traces used as receiver electrodes are denoted Rx (and have a positive slope in FIG. 7A). In FIGS. 7B through 7D, the density of the wire traces greater than that of FIG. 7A—such that each RGBG display pixel (labelled 610 in FIG. 6A) is intersected by two wire traces, e.g., wire traces run between subpixels. However, due to the Red 604 and Blue 608 emitters having different sizes in the example, the pitch of the wire traces in FIGS. 7B through 7D varies. Specifically, consecutive wire traces that extend along edges of the full RGBG pixels 610 have a constant pitch, and consecutive wire traces that intersect the RGBG pixels (e.g., run through the interior regions of individual RGBG pixels) also have a constant pitch, but the pitch of a respective wire trace that intersects a respective RGBG pixel and an adjacent wire trace that extends along an edge of said respective RGBG pixel is not constant because, for example, the respective wire traces that intersect respective RGBG pixels do not bisect individual RGBG pixels).

In FIGS. 7A and 7B, wire traces function as an independent transmitter electrode (Tx) or receiver electrode (Rx)—such as a transmitter electrode of the transmitter electrodes 352 or a receiver electrode of the receiver electrodes 354, previously described. In FIGS. 7C and 7D, groups of individual wire traces (e.g., two or three wire traces) are ohmically shorted or ganged together such that individual receiver electrodes, e.g., the receiver electrodes 354, and individual transmitter electrodes, e.g., the transmitter electrodes 352, are formed from multiple individual wire traces. In FIG. 7C, pairs of wire traces are ohmically shorted such that each pair of wire traces functions as an independent transmitter electrode or receiver electrode. In FIG. 7D, groups of three wire traces are ohmically shorted together such that each transmitter electrode or receiver electrode is formed from a triplet of wire traces.

Various factors may be considered in deciding the density of conductors and whether to gang conductors together. For example, increasing the density of wire traces, e.g., from the density of FIG. 7A to the density of FIG. 7B, increases the resolution of the capacitive sensor, e.g., the fingerprint sensors 202/405b. Increasing the number of wire traces that are grouped or ganged together to form transmitter and receiver electrodes of a capacitive sensor can increase the signal strength provided by each sensor electrode and thereby decrease the signal-to-noise ratio. Increasing the number of wire traces that are grouped together to form transmitter and receiver electrodes of a capacitive sensor can also increase the yield rate of sensor electrodes during manufacture. For example, open circuits unintentionally introduced into individual wire traces during a manufacturing process are less likely to result in a non-functioning sensor electrodes if the sensor electrodes are formed from pairs or larger groupings of individual wire traces. However, for a given density of wire traces, increasing the number of individual wire traces grouped together to form individual sensor electrodes will decrease the resolution of the capacitive sensor. For a given grouping of individual wire traces into sensor electrodes (e.g., pairs, triplets, etc.), increasing the density of wire traces can offset the decrease in resolution that results from grouping of wire traces and further provide increased sensor electrode signal strength and signal-to-noise ratio.

Figure 7E:
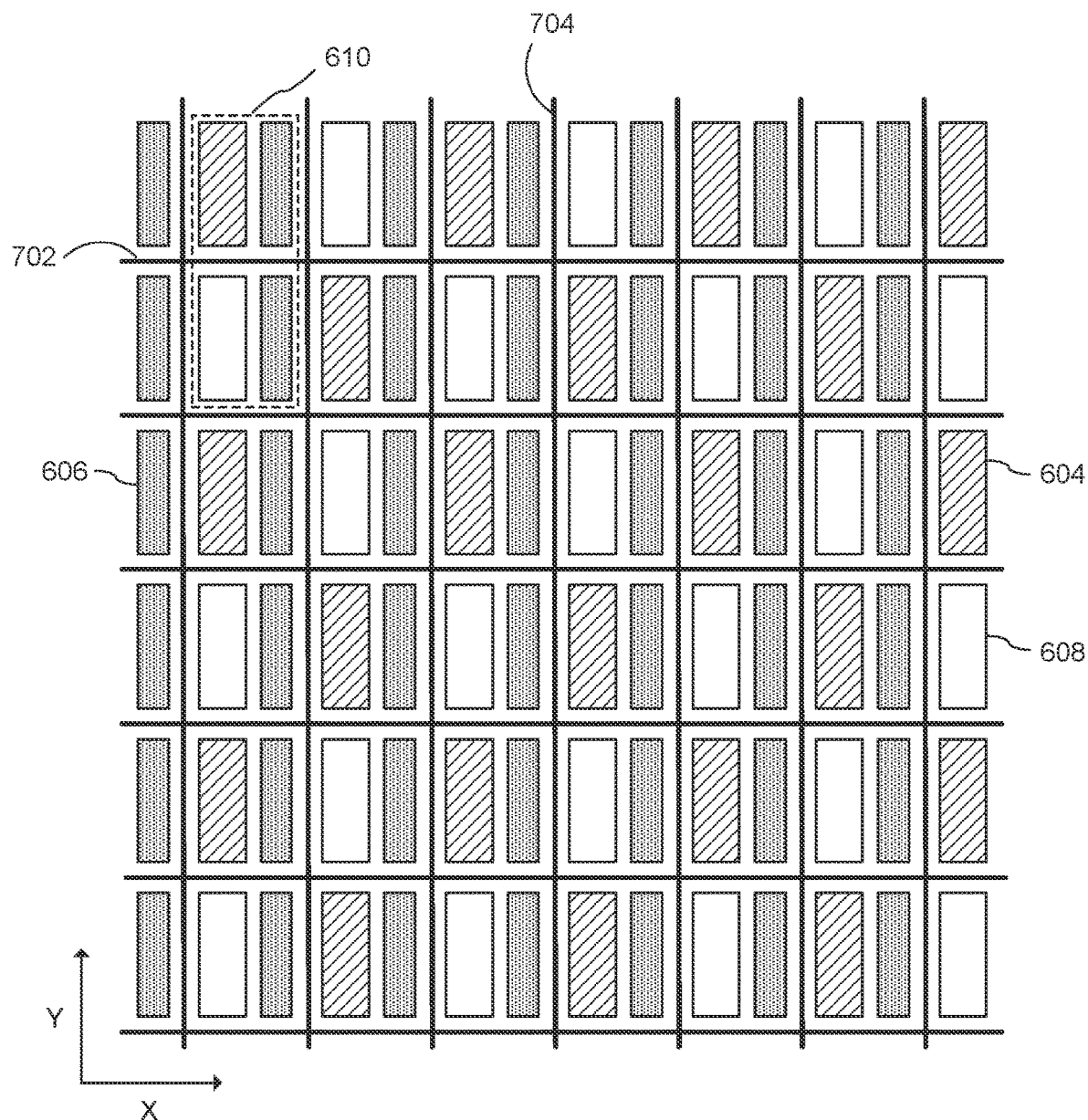

FIG. 7E illustrates a regular PenTile array with a conductor, e.g., wire trace, configuration in which wire traces running in the horizontal direction 702 both extend along boundaries of adjacent pixels 610 of the OLED layer and intersect individual pixels 604, 606, 608 (e.g., run through the interior regions of individual pixels of the OLED layer), while wire traces running in the vertical direction 704 only extend along boundaries of adjacent pixels 610 and do not intersect any individual pixels 604, 606, 608 of the OLED layer. Due to the rectangular shape of the pixels of the OLED layer of the regular PenTile array illustrated in FIG. 7E, the wire traces running in the horizontal direction have the same pitch as the wire traces running in the vertical direction—despite the wire traces running in the horizontal direction having a density of two wire traces per pixel height, while the wire traces running in the vertical direction have a density of one wire trace per pixel width. It will be appreciated that variations in wire trace pitch in both the horizontal and vertical directions are contemplated in various embodiments having OLED emitter configurations that differ from that illustrated in FIG. 7E. It will also be appreciated that individual wire traces overlaid above emitters of the regular PenTile OLED array illustrated in FIG. 7E can be grouped together to form sensor electrodes in the same or a similar fashion to the groupings described above in connection with FIGS. 7A through 7D. Yet further, it will be appreciated that additional groupings and OLED configurations not expressly described herein are also possible within the scope of the present disclosure.

Fingerprint sensors, such as fingerprint sensors 202/405b, require sufficient sensor resolution to detect individual ridges and valleys of a finger. In particular, fingerprint sensors typically require a transmitter electrode and receiver electrode pitch of approximately 100 microns or less. Each of FIGS. 7A through 7E illustrate individual wire traces—extending between adjacent OLED pixel pairs and intersecting individual OLED pixels—that serve, either individually or in pairs or triplets, etc., as receiver electrodes extending in a first direction (e.g., a positive sloping direction in FIGS. 7A through 7D, a horizontal direction in FIG. 7E) or as transmitter electrodes extending in a second direction perpendicular to the first direction (e.g., a negative sloping direction in FIGS. 7A through 7D, a vertical direction in FIG. 7E). Such configurations allow for a pitch of 100 microns or less between adjacent sensor electrodes. Therefore, in the case of fingerprint sensors 202/405b, adjacent transmitter electrodes, e.g., adjacent transmitter electrodes 352, are formed from individual wire traces extending in a first direction between adjacent OLED pixel pairs and intersecting individual OLED pixels—or from groups (e.g., pairs or triplets) of such individual wire traces. Similarly, adjacent receiver electrodes, e.g., adjacent receiver electrodes 354, are formed from individual wire traces extending in a second direction, perpendicular to the first direction, between adjacent OLED pixel pairs and intersecting individual OLED pixels—or from groups (e.g., pairs or triplets) of such individual wire traces.

Touch sensors, e.g., touch sensors 102/405a, do not require as high of sensor resolution as a fingerprint sensor. For touch sensors, where the demands for sensor resolution are not as high, conductors, e.g., wire traces, extending in a first direction, along boundaries of adjacent pixels and intersecting individual pixels of an OLED layer, can be ohmically shorted with wire traces extending in a second direction, along boundaries of adjacent pixels and intersecting individual pixels of an OLED layer, perpendicular to the first direction. As a result, all wire traces in a particular region of the xy-plane, e.g., a tile in the xy-plane, can form a plurality (an aggregation) of electrically common wire traces that functions as a touch sensor tixel, e.g., a tixel 405c of the touch sensor 405a. Individual touch sensor tixels, e.g. respective aggregations of electrically common wire traces, can then be electrically connected with one another to form sensor electrodes. For example, individual touch sensor tixels can be connected with one another along a first direction to form transmitter electrodes, e.g., transmitter electrodes 352 of touch sensors 102/405a, and other individual tixels can be connected with one another along a second direction to form receiver electrodes, e.g., receiver electrodes 354 of touch sensors 102/405a.

Figure 8:
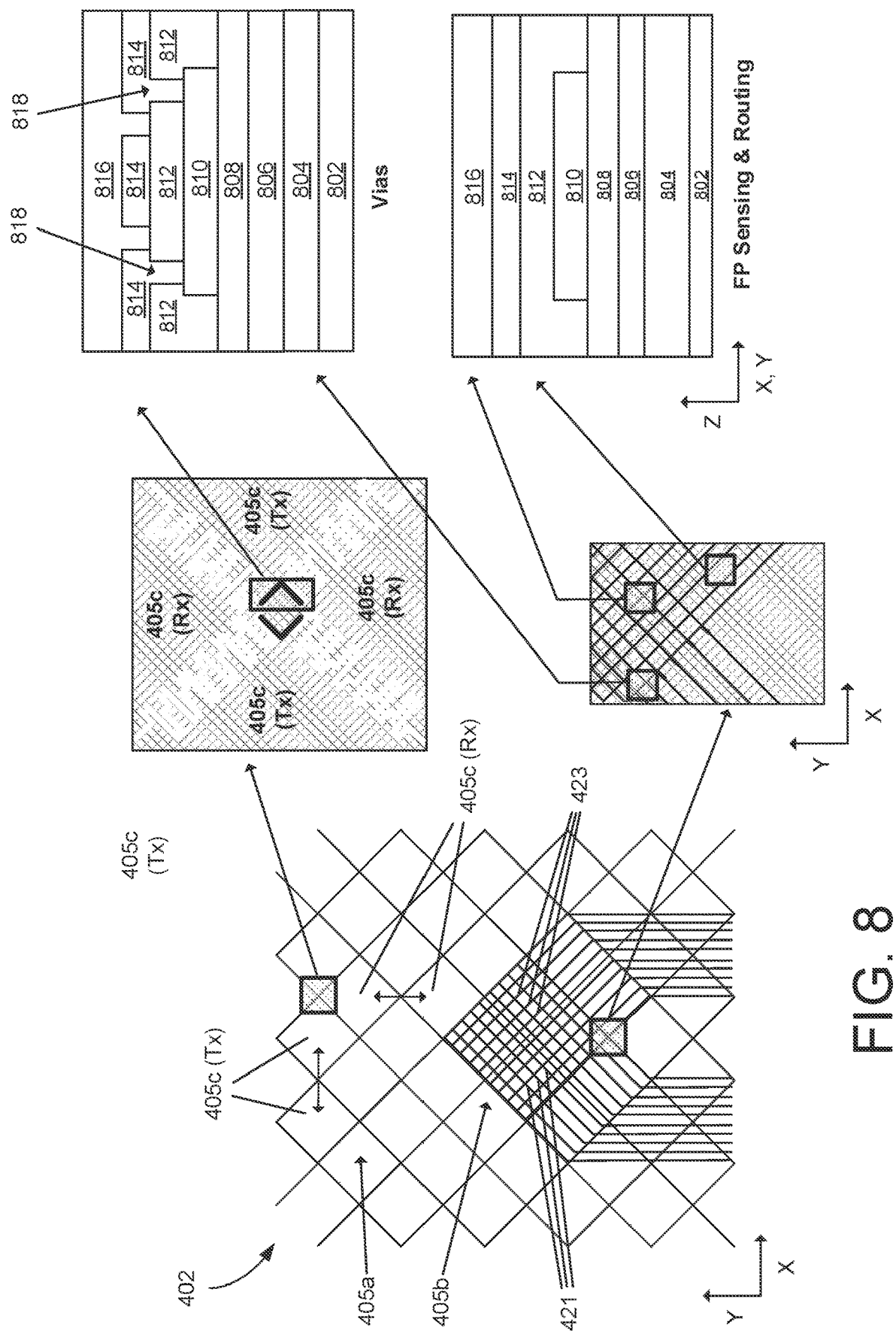
FIG. 8 illustrates plan and cross-sectional views of a portion of an active area of a OLED display of an electronic device having a touch sensor and a fingerprint sensor.
Figure 9:
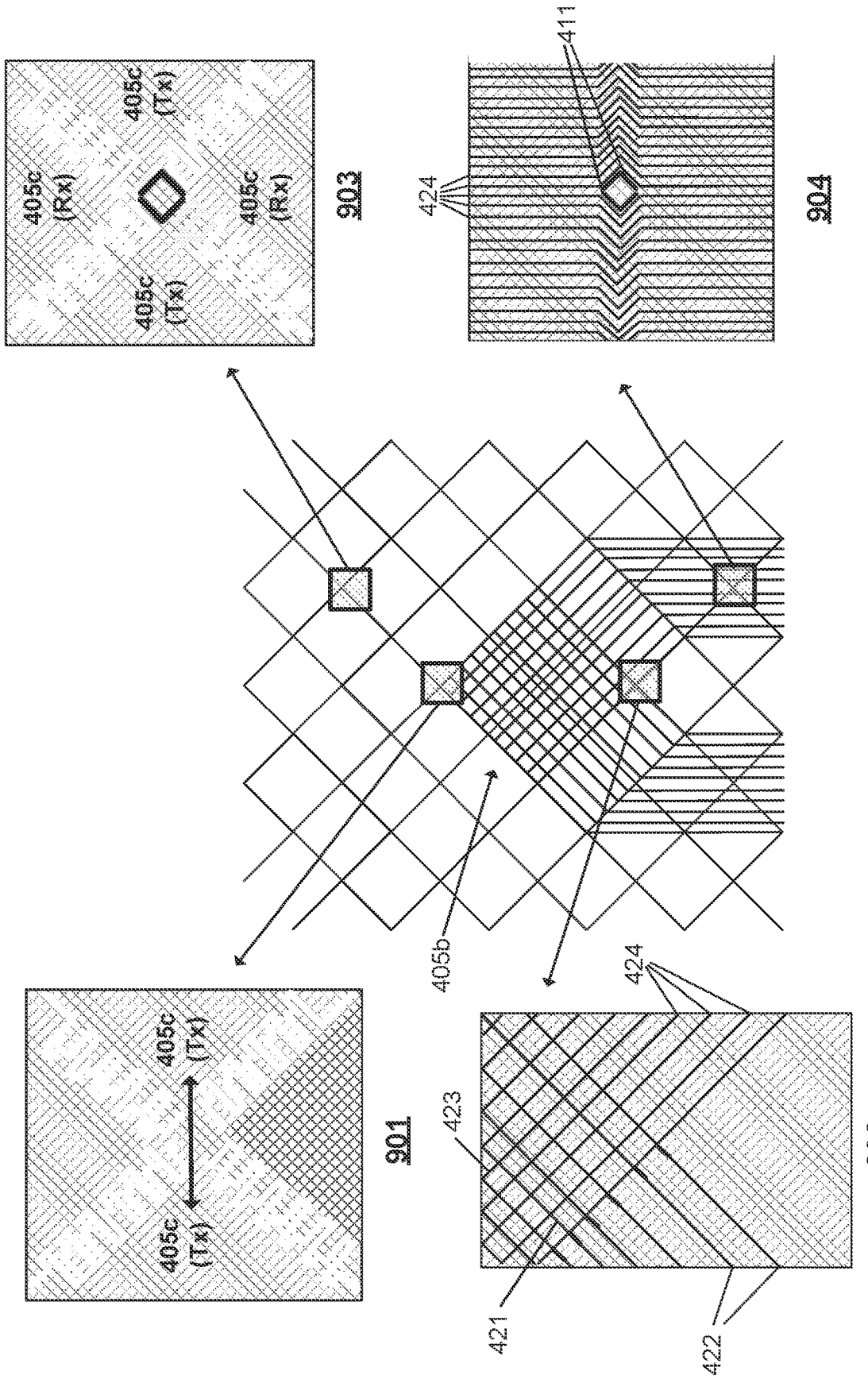
FIG. 9 illustrates detailed views of portions of the active area of the display of an electronic device having a touch sensor and a fingerprint sensor.

FIG. 8 and FIG. 9 illustrate various embodiments of routing conductors using, for example, vertically spaced apart first and second metal layers to provide touch and fingerprint sensor electrodes. The metal layers are selectively interconnected using vias to achieve appropriate routing.

FIG. 8 illustrates, in both an xy-plane and a z-direction perpendicular to the xy-plane, one possible configuration for a touch sensor display stack that corresponds to different regions of a portion of the active area 402 of the display of the electronic device 400. It will be appreciated that the configuration depicted in FIG. 8 is merely one possible configuration, and that a variety of other configurations are also possible.

The touch sensor display stack includes a thin film transistor (TFT) layer 802, e.g., formed on polyimide (PI), an OLED layer 804, a thin-film encapsulation (TFE) 806, and a buffer 808. The OLED layer 804 (which corresponds, e.g., to the combination of the anode 504, OLED layer 506, and cathode 508 of the touch sensor display stack of FIG. 5) includes an anode and cathode, as well as an emissive layer that contains, for example, red, green, and blue emitter regions which are arranged, in the xy-plane, to form pixels.

The touch sensor display stack additionally includes a first metal layer (Metal 1) 810, an inorganic layer (e.g., SiNx) 812, which serves as an insulator, and a second metal layer (Metal 2) 814, which collectively form a metal mesh sensor layer (e.g., the MM sensor layer 516 of the touch sensor display stack of FIG. 5) that is disposed between the buffer 808 and an organic layer 816. FIG. 8 illustrates, in a fingerprint sensor and routing area, a view of the touch sensor display stack that corresponds to a portion of the xy-plane in which the first metal layer 810 is electrically isolated from the second metal layer 814 by the insulating inorganic layer 812.

FIG. 8 also illustrates a view of the touch sensor display stack in which vias 818 connect the first metal layer 810 and the second metal layer 814. In this manner, two isolated regions of the second metal layer 814—which are not electrically connected to one another in the second metal layer but are instead isolated from one another in the depth of the second metal layer by the insulator layer 812—can be electrically connected to one another through the first metal layer 810. It will be appreciated that, in alternate embodiments, two metal regions formed in the first metal layer 810 that are not electrically connected to one another can be electrically connected by vias and a metal portion in the second metal layer 814. The respective elevations of the first and second metal layers in the touch sensor display stack can also be, in alternative embodiments, reversed from that illustrated in FIG. 8.

As is illustrated in FIG. 8, in a region of the active area 402 that corresponds to the touch sensor 405a, adjacent transmitter tixels 405c (Tx), which are formed from aggregations of electrically common wire traces formed in the second metal layer 814, are connected, in the horizontal direction (as shown by the horizontal arrow in the xy plane), by electrical connections formed in the second metal layer 814. Alternatively stated, in the horizontal direction, the adjacent transmitter tixels 405c (Tx) are formed by aggregations of electrically common wire traces formed in the second metal layer 814 that are continuous with one another in the second metal layer 814. In this manner, individual touch sensor transmitter electrodes, e.g., the transmitter electrodes 352 of FIG. 3, are formed by continuous aggregations of electrically common wire traces formed in the second metal layer 814.

In the same region of the active area 402, which corresponds to the touch sensor 405a, receiver tixels 405c are connected, in the vertical direction, by vias connected to wire traces formed in the first metal layer 810. The receiver tixels 405c are formed from aggregations of a plurality of electrically common wire traces formed in the second metal layer 814 that are, in the second metal layer 814, electrically isolated from other tixels 405c (e.g., isolated, in the second metal layer, from both other transmitter tixels 405c (Tx) and other receiver tixels 405c (Rx)). In this manner, individual touch sensor receiver electrodes, e.g., the receiver electrodes 354 of FIG. 3, are formed by connecting individual receiver tixels 405c (Rx) with wire traces formed in the first metal layer 810 using vias 818, which connect the first metal layer 810 to the second metal layer 814. In this manner, isolated aggregations of a plurality of electrically common wire traces formed in the second metal layer 814 (e.g., receiver tixels 405c (Rx)) are electrically connected to one another in a vertical direction, as is illustrated by the vertical arrow in the xy plane, through wire traces in the first metal layer.

As is also illustrated in FIG. 8, in a region of the active area 402 that corresponds to the fingerprint sensor 405b, individual wire traces formed in the first metal layer 810 and extending in a first direction, are electrically isolated, by for example the inorganic SiNx layer 812, from individual wire traces formed in the second metal layer 814 that extend in a second direction perpendicular to the first direction. In this manner, individual wire traces formed in the first metal layer 810 can act as individual sensor electrodes of the fingerprint sensor 405b, e.g., transmitter electrodes 421, and individual wire traces formed in the second metal layer 814 can act as a second set of sensor electrodes of the fingerprint sensor 405b, e.g., receiver electrodes 423. However, multiple individual wire traces formed in either of the first metal layer 810 or the second metal layer 814 can also be electrically shorted together to form, e.g., pairs or triplets of wire traces that collectively form a single transmitter electrode or receiver electrode of the fingerprint sensor 405b—as is illustrated, e.g., in FIG. 7B or 7C.

The touch sensor display stack illustrated in FIG. 8 provides a single metal mesh sensor layer—having only a first metal layer 810 and a second metal layer 814 separated, in a z-direction, by an insulting layer 812—that provides both the touch sensor 405a and the fingerprint sensor 405b. For example, in the touch sensor display stack illustrated in FIG. 8, the second metal layer 814 forms each of: (i) aggregations of electrically common wire traces forming transmitter touch sensor tixels 405c (Tx), which correspond to a first set of touch sensor regions, continuous with one another in the horizontal direction (the continuous aggregations constitute transmitter electrodes of the touch sensor 405a), (ii) aggregations of electrically common wire traces forming isolated receiver touch sensor tixels 405c (Rx), which correspond to a second set of touch sensor regions that are disposed in columns in the vertical direction (the second set of touch sensor regions, when electrically connected through the first metal layer 810, form receiver electrodes of the touch sensor 405a), and (iii) individual wire traces, extending in a first diagonal direction, forming transmitter electrodes 421 of the fingerprint sensor 405b. The first metal layer 810 forms each of (iv) wire traces that electrically connect, in the vertical directions, the isolated receiver touch sensor tixels 405c to form receiver electrodes of the touch sensor 405b, (v) individual wire traces, extending in a second diagonal direction perpendicular to the first diagonal direction, forming receiver electrodes 423 of the fingerprint sensor 405b—and further being connected to the sensor circuitry 406, and (vi) routing conductors that connect the individual wire traces forming the transmitter electrodes 421 of the fingerprint sensor 405b to the sensor circuitry 406.

FIG. 9 illustrates, in the xy-plane, a portion of the active area 402, of the electronic device 400 of FIG. 4, where the fingerprint sensor 405b and a portion of the touch sensor 405a are disposed.

FIG. 9 includes a first detail 901 that illustrates a first region of the active area 402, which includes a portion of the fingerprint sensor 405b and a series of tixels 405c of the touch sensor 405a. As can be seen in the first detail 901, two of the tixels 405c of the touch sensor 405a (i.e., two transmitter tixels 405c (Tx)) are formed from aggregations of wire traces in the second metal layer 814 that are continuous with one another in the horizontal direction (as is shown by the arrow running between the two transmitter tixels 405c (Tx)). As is also illustrated in the first detail 901, the fingerprint sensor 405b includes a first set of individual wire traces, formed in the second metal layer 814 and extending in a first direction, that form transmitter electrodes of the fingerprint sensor 405b and a second set of individual wire traces, formed in the first metal layer 810 and extending in a second direction perpendicular to the first direction, that form receiver electrodes of the fingerprint sensor 405b.

In the second detail 902, which illustrates a second region of the active area 402 that includes a portion of the fingerprint sensor 405b and electrical connections (formed by transmitter connector conductors 422) between transmitter electrodes 421 of the fingerprint sensor 405b and the sensor circuitry 406 and electrical connections (formed by receiver connector conductors 424) between receiver electrodes 423 of the fingerprint sensor 405b and the sensor circuitry 406. The transmitter and receiver connector conductors 422, 424 are shown as metal traces formed in the first metal layer 810.

The third detail 903 illustrates a region of the active area 402 that includes four tixels 405c of the touch sensor 405a. Two of the tixels are aggregations of electrically common wire traces, formed in the second metal layer 814, that are continuous with one another in the horizontal direction (e.g., transmitter tixels 405c (Tx)). The other two tixels are aggregations of electrically common wire traces that are isolated from one another in the second metal layer 814 but connected to one another in the vertical direction through wire traces 411 (e.g., vias 818) formed in the first metal layer 810 (e.g., receiver tixels 405c (Rx)).

The fourth detail 904 illustrates a region of the active area 402 that includes the same configuration of tixels as is illustrated in the third detail 903. However, in the fourth detail 904, receiver connector conductors 424 that form electrical connections between the receiver electrodes of the fingerprint sensor 405b and the sensor circuitry 406 are disposed in the first metal layer 810 underneath the aggregations of wire traces, formed in the second metal layer 814, that form the individual tixels of the touch sensor 405a. As can be seen in the fourth detail 904, the wire traces in the first metal layer 810 that form the receiver connector conductors 424 are routed around the wire traces 411 (vias) in the first metal layer 810 that connect the tixels in the vertical direction.

Figure 10:
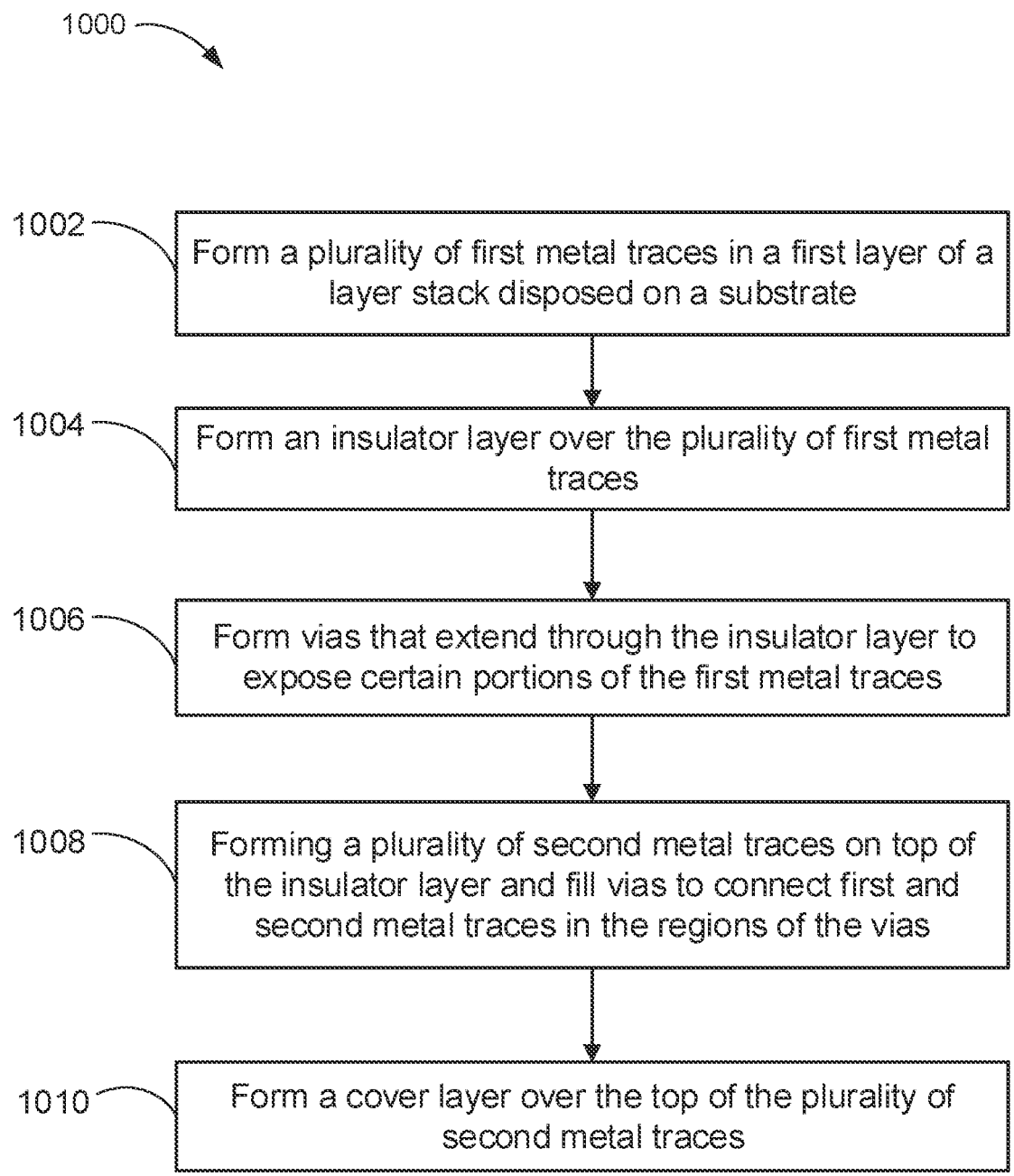
FIG. 10 illustrates a method for forming a capacitive fingerprint sensor and touch sensor in accordance with certain embodiments.

FIG. 10 illustrates a method 1000 for forming a capacitive fingerprint sensor and touch sensor. It will be appreciated that the method need not be performed in the exact sequence shown. For example, the method can be performed in the opposite order. It will further be appreciated that certain steps, such as forming a cover layer, are optional.

At 1002, a plurality of first metal traces are formed in a first layer of a layer stack disposed on a substrate. The substrate is, e.g., an OLED display formed from an OLED display stack. For example, the OLED display stack can have the configuration of FIG. 5 including thin film transistor (TFT) layer 502 formed on a flexible polyimide substrate, anode 504, OLED layer 506, cathode 508, thin film encapsulation (TFE) layer 510, buffer 512, and color filter 514. The OLED display includes an OLED layer, e.g., OLED layer 506, that includes an emissive layer with, for example, red, green, and blue emitter regions which are arranged, in the xy-plane, to form pixels. The emitter regions can be configured as depicted in FIG. 6A or 6B. The plurality of first metal traces formed at 1002 are arranged above the regions of the substrate that extend along boundaries of adjacent pixels of the OLED layer and/or that intersect individual pixels of the OLED layer but that do not lie directly above emitter regions of the OLED layer as generally shown FIGS. 7A through 7E.

The plurality of first metal traces formed at 1002 include individual wire traces, extending in a first direction, forming sensor electrodes, e.g., transmitter electrodes or receiver electrodes, of a fingerprint sensor, e.g., fingerprint sensors 202/405b, as well as electrical connectors (e.g. transmitter connector conductors and receiver connector conductors) that connect said sensor electrodes to sensor circuitry, e.g., the TDDI. The plurality of first metal traces formed at 1002 can further include metal traces configured to electrically connect subsequently deposited isolated touch sensor tixels formed from aggregations of subsequently deposited traces of a second metal layer. In addition, the plurality of first metal traces formed at 1002 can also include routing conductors that are configured to connect subsequently deposited wire traces, which will extend in a second direction perpendicular to the first direction and form additional sensor electrodes, to sensor circuitry, e.g., the TDDI.

At 1004, the method includes forming an insulator layer over the plurality of first metal traces. The insulator can be formed, e.g., from an inorganic SiNx material. At 1006, the method includes forming vias through the insulator layer to expose certain portions of the first metal traces formed at 1002. The vias are formed at portions of the insulator where an electrical connection is desired between the first metal traces and subsequently deposited traces of a second metal layer. For example, vias can extend through the insulator formed at 1004 where an electrical connection is desired between metal traces deposited at 1002 and subsequently deposited isolated touch sensor tixels formed from aggregations of subsequently deposited traces of a second metal layer. In addition, vias can extend through the insulator formed at 1004 where an electrical connection is desired between the metal traces deposited at 1002 that form routing conductors and subsequently deposited wire traces, which will form additional sensor electrodes, that are to be electrically connected to said routing conductors.

At 1008, the method includes forming a plurality of second metal traces on top of the insulator deposited at 1004 and filling the vias to connect the first metal traces and the second metal traces in the regions of the vias. The plurality of second metal traces include wire traces, extending in a second direction perpendicular to the first direction that form sensor electrodes, e.g., transmitter electrodes or receiver electrodes, of a fingerprint sensor, e.g., fingerprint sensors 202/405b. The plurality of second metal traces can additionally include the aggregations of traces of the second metal layer that form the subsequently deposited isolated touch sensor tixels, discussed above in connection with 1002. Furthermore, the plurality of second metal traces can include aggregations of electrically common wire traces that form touch sensor tixels that are continuous with one another in a particular direction.

At 1010, the method includes forming a cover layer over the top of the plurality of second metal traces formed at 1008.

Figure 11A:
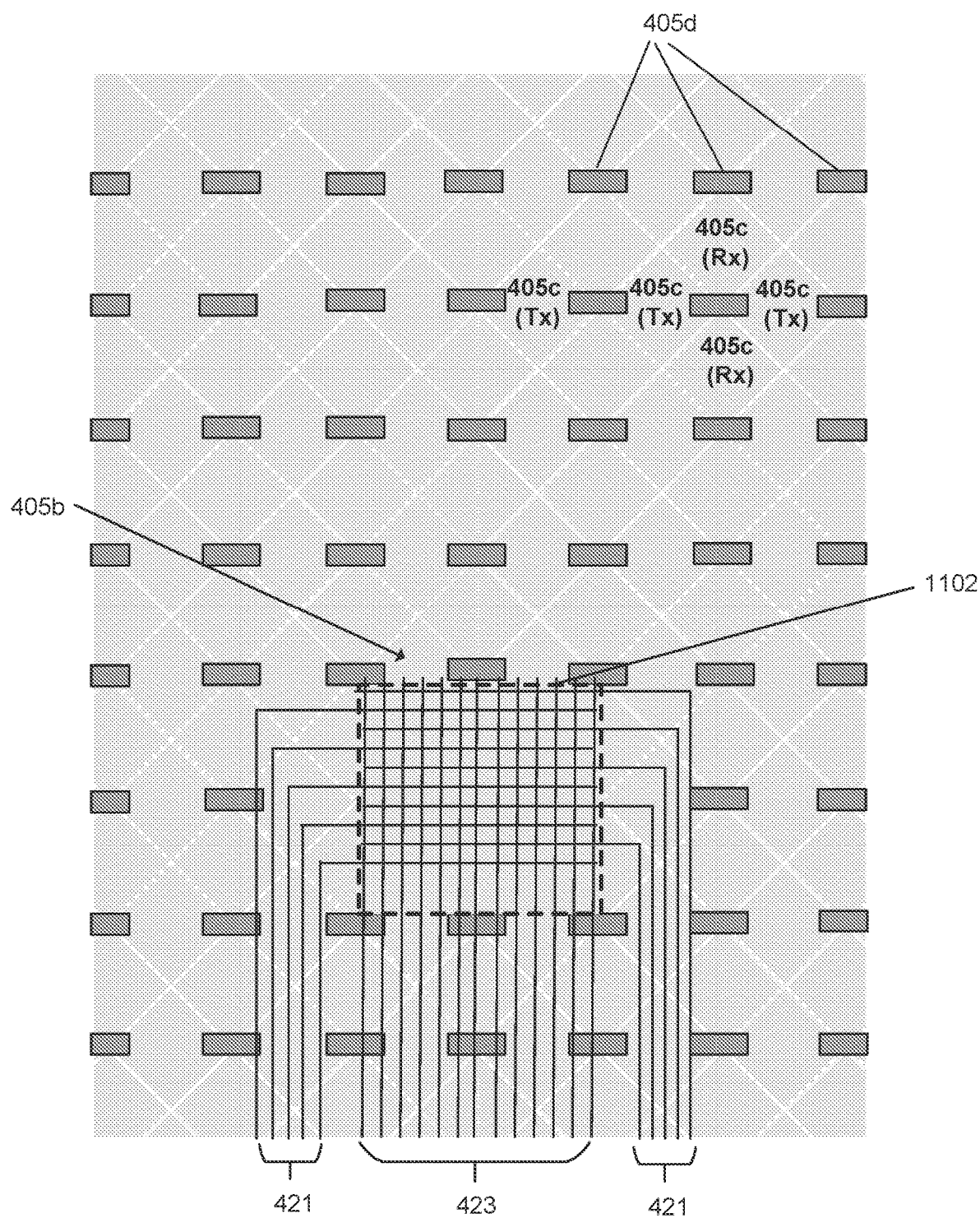
FIGS. 11A and 11B illustrate plan views of alternative routing schemes for individual wire traces of a metal mesh sensor layer for a capacitive fingerprint sensor and touch sensor.
Figure 11B:
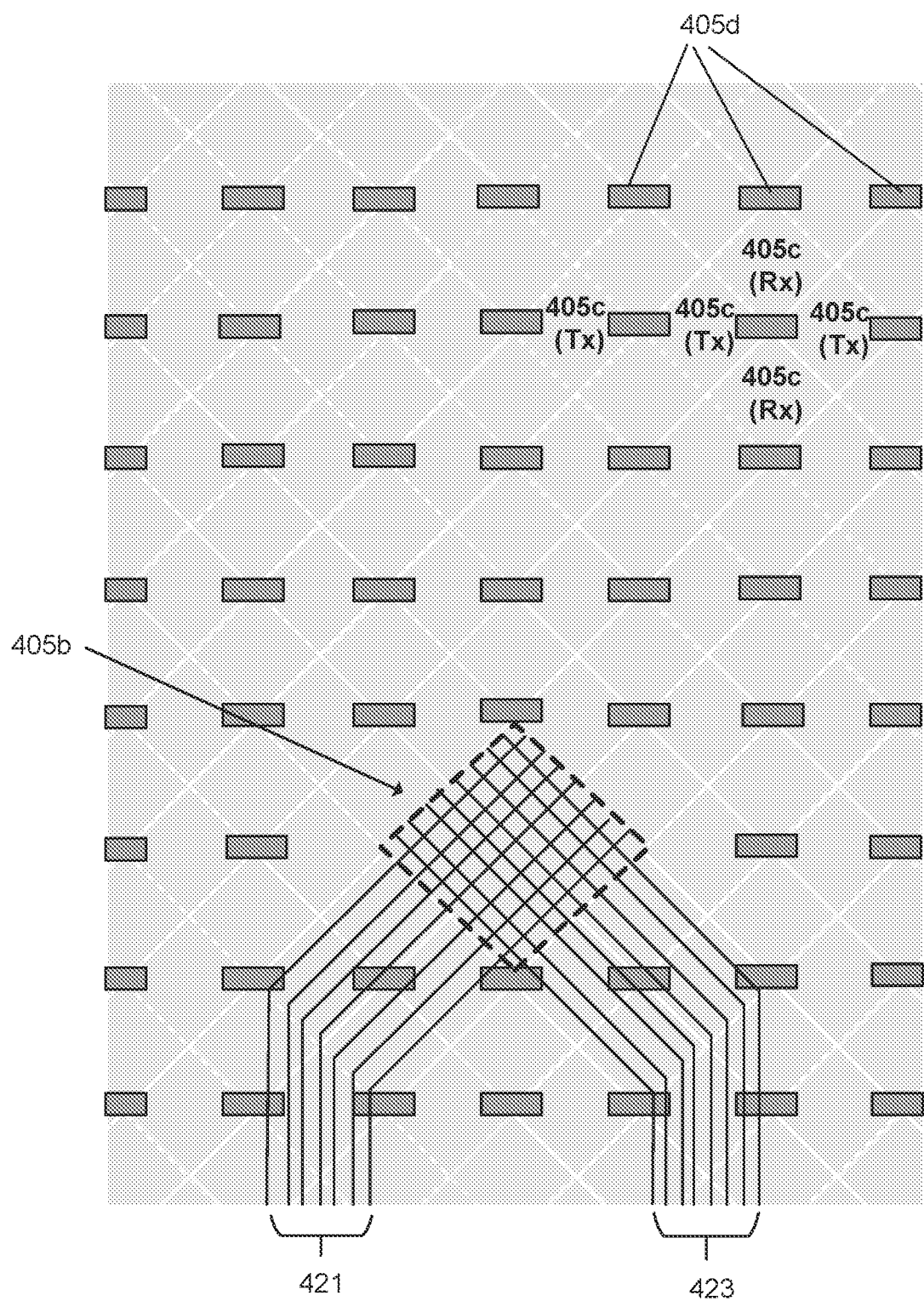

FIGS. 11A and 11B illustrate plan views of alternative routing schemes for individual wire traces of a metal mesh sensor layer (e.g., the MM sensor layer 516 of the touch sensor display stack of FIG. 5 and/or the first and second metal layers 810, 814 of the touch sensor display stack of FIG. 8). The arrangements of FIGS. 11A and 11B can, for example, be produced using the method of FIG. 10.

FIG. 11A illustrates, in an xy-plane, one possible routing scheme for individual wire traces of a metal mesh sensor layer in an active area 402 of the display of the electronic device 400. FIG. 11B illustrates, in an xy-plane, an alternative possible routing scheme for individual wire traces of a metal mesh sensor layer in an active area 402 of the display electronic device 400. It will be appreciated that the configurations depicted in FIGS. 11A and 11B are merely two possible configurations, and that a variety of other configurations are also possible. Similar to the configurations shown in FIGS. 8 and 9, the arrangements of FIGS. 11A and 11B provide for vertical separation of fingerprint sensor receiver and transmitter electrodes in an efficient manner.

FIG. 11A illustrates a portion of an active area 402 of the display of the electronic device 400. The portion of the active area 402 includes both a fingerprint sensor 405b in one region of the active area 402 and a touch sensor 405a in the remaining region of the active area 402 that does not form the fingerprint sensor 405b. The touch sensor 405a is formed from a plurality of transmitter tixels 405c (Tx) and receiver tixels 405c (Rx). Each individual transmitter tixel 405c (Tx) and each individual receiver tixel 405c (Rx) is formed from an aggregation of electrically common wire traces formed a metal layer (e.g., one of the first metal layer 810 or the second metal layer 814 of the touch sensor display stack of FIG. 8).

In the embodiment illustrated in FIG. 11A, adjacent transmitter tixels 405c (Tx) are connected to one another along the horizontal direction by conductor, e.g., wire traces 405d, formed in a different metal layer from the metal layer in which the aggregations of electrically common wire traces that form the individual transmitter tixels 405c (Tx) are located. In the embodiment illustrated in FIG. 11A, adjacent receiver tixels 405c (Rx) are connected to one another along the vertical direction by wire traces formed in the same metal layer as the metal layer in which the aggregations of electrically common wire traces that form the individual receiver tixels 405c (Tx) are located. In other words, the aggregations of electrically common wire traces that form the individual receiver tixels 405c (Rx) are aggregated together in the vertical direction by other electrically common wire traces in the same metal layer.

In the embodiment illustrated in FIG. 11A, the fingerprint sensor transmitters 421 and fingerprint sensor receivers 423 are formed—in the remaining region of the active area 402 that does not form the fingerprint sensor 405b—in a different metal layer from the metal layer in which the aggregations of electrically common wire traces that form the individual transmitter tixels 405c (Tx) and receiver tixels 405c (Rx) are located. For example, with reference to FIG. 8, if the aggregations of electrically common wire traces are disposed in the first metal layer 810 then the transmitters 421 and the receivers 423 are formed—in the remaining region of the active area 402 that does not form the fingerprint sensor 405b—in the second metal layer 814.

Within the region of the active area 402 that is occupied by the fingerprint sensor 405b, either the fingerprint sensor transmitters 421 or the fingerprint sensor receivers 423 are disposed in the same metal layer as the metal layer in which the aggregations of electrically common wire traces that form the transmitter tixels 405c (Tx) and the receiver tixels 405c (Rx) are located, while the other of the fingerprint sensor transmitters 421 or the fingerprint sensor receivers 423 remain in the same metal layer in which they are disposed outside of the region of the active area 402 that is occupied by the fingerprint sensor 405b. For example, with reference to FIG. 8, if the aggregations of electrically common wire traces are disposed in the first metal layer 810 then—within the region of the active area occupied by the fingerprint sensor 405b—either the fingerprint sensor transmitters 421 or the fingerprint sensor receivers 423 are disposed in the first metal layer 810, while the other of the fingerprint sensor transmitters 421 or the fingerprint sensor receivers 423 are disposed in the second metal layer 814.

Along or near the boundary of the region 1102 that is occupied by the fingerprint sensor 405b and the remaining area occupied by the touch sensor 405a, vias are provided to connect (i) the wire traces that form the fingerprint sensor transmitters 421 or the fingerprint sensor receivers 423 within the region that is occupied by the fingerprint sensor 405b to (ii) the wire traces that form the same fingerprint sensor transmitters 421 or fingerprint sensor receivers 423 in the remaining area occupied by the touch sensor 405a.

In the embodiment illustrated in FIG. 11A, the wire traces that form the fingerprint sensor transmitters 421 extend in the horizontal direction within the region of the active area 402 that is occupied by the fingerprint sensor, while the wire traces that form the fingerprint sensor receivers 423 extend in the vertical direction within the region of the active area 402 that is occupied by the fingerprint sensor. Of course, it will be understood that the orientation of the fingerprint transmitters and receivers may be reversed.

In the embodiment illustrated in FIG. 11B, the configuration of the various components is similar to that described above in connection with FIG. 11A—except that the fingerprint sensor 405b occupies a diamond-shaped region (instead of a square shaped region), that the wire traces that form the fingerprint sensor transmitters 421 extend in a diagonal, left-to-right-upward direction (instead of a horizontal direction) within the region of the active area 402 that is occupied by the fingerprint sensor. It further differs from FIG. 11A in that the wire traces that form the fingerprint sensor receivers 423 extend in a diagonal, left-to-right-downward direction (instead of a vertical direction) within the region of the active area 402 that is occupied by the fingerprint sensor. The configuration of FIG. 11B is thus similar shown to the arrangement in FIGS. 8 and 9.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (e.g., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A capacitive fingerprint sensor configured to be integrated in a display comprising:
   a plurality of transmitter electrodes, the plurality of transmitter electrodes including:
      a plurality of transmitter conductors formed in a in a first metal layer of a sensor stack and disposed between pixels of the display, and
      a plurality of transmitter conductors formed in the first metal layer of the sensor stack and intersecting pixels of the display; and
   a plurality of receiver electrodes, the plurality of receiver electrodes including:
      a plurality of receiver conductors formed in a second metal layer of the sensor stack and disposed between pixels of the display, and
      a plurality of receiver conductors formed in the second metal layer of the sensor stack and intersecting pixels of the display,
   wherein the receiver electrodes have an orientation different from the plurality of transmitter electrodes.

2. The capacitive fingerprint sensor of claim 1, wherein a distance between (i) each of the plurality of transmitter electrodes and each of the plurality of receiver electrodes and (ii) a sensing surface is 400 microns or less.

3. The capacitive fingerprint sensor of claim 1, wherein each respective transmitter electrode comprises a plurality of conductors.

4. The capacitive fingerprint sensor of claim 1, wherein each respective receiver electrode comprises a plurality of conductors.

5. The capacitive fingerprint sensor of claim 1, wherein:
  each respective receiver electrode is connected to processing circuitry by a respective receiver connector conductor formed in the first metal layer of the sensor stack and connected, by a via, to the respective receiver electrode, or
  each respective transmitter electrode is connected to the processing circuitry by a respective transmitter connector conductor formed in the second metal layer of the sensor stack and connected, by a via, to the respective transmitter electrode.

6. The capacitive fingerprint sensor of claim 1, wherein a vertical distance between (i) each of the plurality of transmitter electrodes and the plurality of receiver electrodes and (ii) the pixels of the display is 10 microns or less.

7. The capacitive fingerprint sensor of claim 1, further comprising:
  a control circuit configured to transmit sensing signals on the plurality of transmitter electrodes and to receive resulting signals on the receiver electrodes.

8. An input device comprising:
  a display, the display formed from a plurality of display layers of a display stack;
  a touch sensor comprising a plurality of first touch sensor electrodes and a plurality of second touch sensor electrodes, each of the plurality of first touch sensor electrodes formed from aggregations of conductors disposed in a first metal layer of a sensor stack, each of the plurality of second touch sensor electrodes formed from aggregations of conductors disposed in the first metal layer of the sensor stack and connected by conductors disposed in a second metal layer of the sensor stack, the sensor stack being disposed on top of the display layers in the display stack; and
  a capacitive fingerprint sensor comprising:
    a plurality of first fingerprint sensor electrodes, the plurality of first fingerprint sensor electrodes including:
      a plurality of first conductors disposed in the first metal layer of the sensor stack and disposed between pixels of the display, and
      a plurality of first conductors disposed in the first metal layer of the sensor stack and intersecting pixels of the display, and
    a plurality of second fingerprint sensor electrodes, the plurality of second fingerprint sensor electrodes including:
      a plurality of second conductors disposed in the second metal layer of the sensor stack and disposed between pixels of the display, and
      a plurality of second conductors disposed in the second metal layer of the display and intersecting pixels of the display.

9. The input device of claim 8, wherein the touch sensor is disposed above a first region of the display and the fingerprint sensor is disposed above a second region of the display.

10. The input device of claim 8, wherein each respective first fingerprint sensor electrode comprises a plurality of conductors disposed in the first metal layer of the sensor stack, and
  wherein each respective second fingerprint sensor electrode comprises a plurality of conductors disposed in the second metal layer of the sensor stack.

11. The input device of claim 8, further comprising a cover stack being disposed on top of the sensor stack, wherein the cover stack has a thickness of less than 400 microns.

12. The input device of claim 8, wherein the display layers include one or more emitter layers, and wherein a vertical distance between the one or more emitter layers and one of the first metal layer of the sensor stack and the second metal layer of the sensor stack is 10 microns or less.

13. The input device of claim 9, further comprising:
  a control circuit configured to transmit sensing signals on transmitter electrodes and to receive resulting signals on receiver electrodes.

14. The input device of claim 13, wherein the first fingerprint sensor electrodes formed from conductors disposed in the first metal layer of the sensor stack are connected to the control circuit by conductors disposed above the second region of the display in the second metal layer of the sensor stack.

15. The input device of claim 14, wherein the plurality of display layers include an anode, a cathode, and an organic light emitting diode (OLED) layer.

16. The input device of claim 15, further comprising a cover stack, the cover stack being disposed on top of the sensor stack, wherein the cover stack has a thickness of less than 400 microns.

17. A method of making a capacitive fingerprint sensor comprising:
  forming a plurality of first conductors in a first metal layer of a sensor stack;
  forming an insulating layer on top of the first metal layer in the sensor stack; and
  forming a plurality of second conductors in a second metal layer of the sensor stack, the second metal layer being formed on top of the insulating layer;
  wherein at least a portion of the plurality of first conductors form a plurality of transmitter electrodes or a plurality of receiver electrodes of the capacitive fingerprint sensor, the portion of the plurality of first conductors including both (i) a plurality of first conductors disposed between pixels of a display and (ii) a plurality of first conductors intersecting pixels of the display, and
  wherein at least a portion of the plurality of second conductors form the other of the plurality of transmitter electrodes or the plurality of receiver electrodes not formed by the first conductors, the portion of the plurality of second conductors including both (i) a plurality of second conductors disposed between pixels of the display and (ii) a plurality of second conductors intersecting pixels of the display.

18. The method of claim 17, further comprising forming a cover stack on top of the sensor stack, wherein a vertical distance between a top of the sensor stack and a top of the cover stack is 400 microns or less.

19. The method of claim 17, wherein the sensor stack is formed on top of a display stack, the display stack including one or more emitter layers, and
  wherein a vertical distance of between the one or more emitter layers and one of the first metal layer of the sensor stack and the second metal layer of the sensor stack is 10 microns or less.

20. The method of claim 17, further comprising providing vias extending through the insulating layer to connect the first conductors to the second conductors.

* * * * *